US012525701B2

(12) United States Patent
Han et al.

(10) Patent No.: US 12,525,701 B2
(45) Date of Patent: Jan. 13, 2026

(54) DISPLAY DEVICE AND MANUFACTURING METHOD THEREOF

(71) Applicant: Chengdu Tianma Microelectronics Co., Ltd., Sichuan (CN)

(72) Inventors: Xiaonan Han, Chengdu (CN); Zhenyu Jia, Chengdu (CN); Kerui Xi, Chengdu (CN); Baiquan Lin, Chengdu (CN); Yifan Xing, Chengdu (CN); Feng Qin, Chengdu (CN); Qiongqin Mao, Chengdu (CN)

(73) Assignee: Chengdu Tianma Microelectronics Co., Ltd., Chengdu (CN)

( * ) Notice: Subject to any disclaimer, the term of this patent is extended or adjusted under 35 U.S.C. 154(b) by 486 days.

(21) Appl. No.: 18/076,050

(22) Filed: Dec. 6, 2022

(65) Prior Publication Data
US 2023/0099689 A1   Mar. 30, 2023

(30) Foreign Application Priority Data

Sep. 8, 2022   (CN) ........................ 202211097748.9

(51) Int. Cl.
*H01Q 1/22* (2006.01)
*H01Q 1/48* (2006.01)
*H01Q 21/00* (2006.01)
*H01Q 21/08* (2006.01)
*H05K 1/02* (2006.01)

(52) U.S. Cl.
CPC ................. *H01Q 1/22* (2013.01); *H01Q 1/48* (2013.01); *H01Q 21/0006* (2013.01); *H01Q 21/08* (2013.01); *H05K 1/0216* (2013.01); *H05K 1/028* (2013.01); *H05K 2201/10098* (2013.01); *H05K 2201/10128* (2013.01)

(58) Field of Classification Search
CPC ........ H01Q 1/22; H01Q 1/48; H01Q 21/0006; H01Q 21/08; H05K 1/0216; H05K 1/028; H05K 2201/10098; H05K 2201/10128
See application file for complete search history.

(56) References Cited

U.S. PATENT DOCUMENTS

2018/0331430 A1* 11/2018 Xiang ................. H01Q 9/0407

FOREIGN PATENT DOCUMENTS

CN    102934531 A    2/2013
CN    210866465 U    6/2020

* cited by examiner

Primary Examiner — Henry Luong
(74) Attorney, Agent, or Firm — KDW Firm PLLC

(57) ABSTRACT

Provided are a display device and a manufacturing method thereof. The display device includes a display assembly, an antenna, and a feed circuit board. At least part of the antenna is disposed on the side of the light emission surface of the display assembly. The antenna includes a radiator and a first feed structure connected to the radiator. The feed circuit board is disposed on the side of the display assembly facing away from the light emission surface. The feed circuit board includes a power division network and a second feed structure connected to the power division network. The first feed structure at least partially overlaps the second feed structure along the thickness direction of the display assembly.

28 Claims, 23 Drawing Sheets

DISPLAY DEVICE AND MANUFACTURING METHOD THEREOF

CROSS-REFERENCE TO RELATED APPLICATION(S)

This application claims priority to Chinese Patent Application No. 202211097748.9 filed Sep. 8, 2022, the disclosure of which is incorporated herein by reference in its entirety.

TECHNICAL FIELD

The present disclosure relates to the field of display technologies and, in particular, to a display device and a manufacturing method thereof.

BACKGROUND

Mobile phones, tablet computers and other display devices are the electronic devices with the largest consumption, the highest integration, and the highest technical content at present, among which antennas are essential components.

An antenna in an existing display device is fed by a flexible printed circuit (FPC). An anisotropic conductive film (ACF) adhesive is used to bond the FPC and the antenna, which incurs problems such as a wide bezel and large insertion loss.

SUMMARY

The present disclosure provides a display device and a manufacturing method thereof, which reduce bezel, reduce insertion loss, and improve antenna performance at the same time.

According to one aspect of the present disclosure, a display device is provided. The display device includes a display assembly, an antenna, and a feed circuit board.

At least part of the antenna is disposed on one side of the light emission surface of the display assembly.

The antenna includes a radiator and a first feed structure connected to the radiator.

The feed circuit board is disposed on the side of the display assembly facing away from the light emission surface.

The feed circuit board includes a power division network and a second feed structure connected to the power division network.

The first feed structure at least partially overlaps the second feed structure along the thickness direction of the display assembly.

According to another aspect of the present disclosure, a manufacturing method of a display device is provided and includes steps described below.

An antenna is disposed on the side of the light emission surface of a display assembly. The antenna includes a radiator and a first feed structure connected to the radiator.

A feed circuit board is disposed on the side of the display assembly facing away from the light emission surface. The feed circuit board includes a power division network and a second feed structure connected to the power division network. The first feed structure at least partially overlaps the second feed structure along the thickness direction of the display assembly.

According to another aspect of the present disclosure, a manufacturing method of a display device is provided and includes steps described below.

An antenna is disposed on a protection structure. The antenna includes a radiator and a first feed structure connected to the radiator.

The side of the protection structure facing the antenna is fixed to the light emission side of a display assembly.

A feed circuit board is disposed on the side of the display assembly facing away from a light emission surface. The feed circuit board includes a power division network and a second feed structure connected to the power division network. The first feed structure at least partially overlaps the second feed structure along the thickness direction of the display assembly.

According to another aspect of the present disclosure, a manufacturing method of a display device is provided and includes steps described below.

A transparent support film is prepared on one side of a first substrate.

An antenna is disposed on the side of the transparent support film facing away from the first substrate. The antenna includes a radiator and a first feed structure connected to the radiator.

The first substrate is peeled off.

The transparent support film and the antenna are fixed to the light emission side of a display assembly.

A feed circuit board is disposed on the side of the transparent support film facing away from the antenna. The feed circuit board includes a power division network and a second feed structure connected to the power division network. The first feed structure at least partially overlaps the second feed structure along the thickness direction of the transparent support film.

According to the embodiments of the present disclosure, in the display device and the manufacturing method thereof, at least part of the antenna is disposed on the side of the light emission surface of the display assembly to reduce signal interference, thereby improving the radiation performance of the antenna signal and solving the problem of poor radiation performance of the antenna signal. The feed circuit board is disposed on the side of the display assembly facing away from the light emission surface so that the space of the bezel region on the side of the light emission surface of the display assembly is prevented from being occupied by the feed circuit board bonding, thereby facilitating the implementation of a narrow bezel. At the same time, along the thickness direction of the display assembly, the first feed structure at least partially overlaps the second feed structure so that the coupling connection between the antenna and the feed circuit board is implemented. The transmission of the radio frequency signal between the antenna and the feed circuit board is ensured, and it does not need to implement the electrical connection by using the ACF adhesive bonding, thereby ensuring the spacing uniformity between the antenna and the feed circuit board and reducing the insertion loss between the antenna and the feed circuit board. Moreover, heating is not required during the coupling connection between the antenna and the feed circuit board, thereby reducing the risk of peeling off the antenna.

It is to be understood that the contents described in this part are not intended to identify key or important features of the embodiments of the present disclosure, and are not intended to limit the scope of the present disclosure. Other features of the present disclosure become readily understood through the description hereinafter.

BRIEF DESCRIPTION OF DRAWINGS

To illustrate technical solutions in the embodiments of the present disclosure more clearly, drawings used in description of the embodiments are briefly described below. Apparently, the drawings described below merely illustrate part of the embodiments of the present disclosure, and those of ordinary skill in the art may obtain other drawings based on the drawings on the premise that no creative work is done.

DETAILED DESCRIPTION

The technical solutions in the embodiments of the present disclosure are described clearly and completely in conjunction with the drawings in the embodiments of the present disclosure from which the solutions of the present disclosure are better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that the terms "first", "second", and the like in the description, claims, and drawings of the present disclosure are used for distinguishing between similar objects and are not necessarily used for describing a particular order or sequence. It is to be understood that the data used in this way are interchangeable where appropriate so that the embodiments of the present disclosure described herein may also be implemented in a sequence not illustrated or described herein. In addition, the terms "including", "having", or any other variations thereof described herein are intended to encompass a non-exclusive inclusion. For example, a process, method, system, product, or device that includes a series of steps or units may include not only the expressly listed steps or units but also other steps or units that are not expressly listed or are inherent to such a process, method, system, product, or device.

Figure 1:
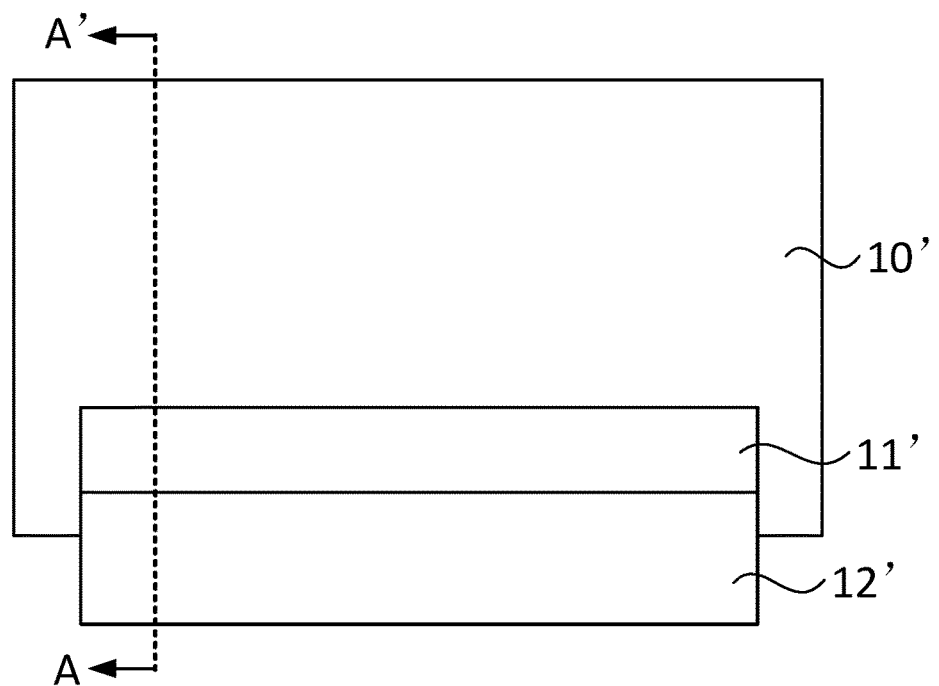
FIG. 1 is a diagram illustrating the structure of a display device in the related art.
Figure 2:
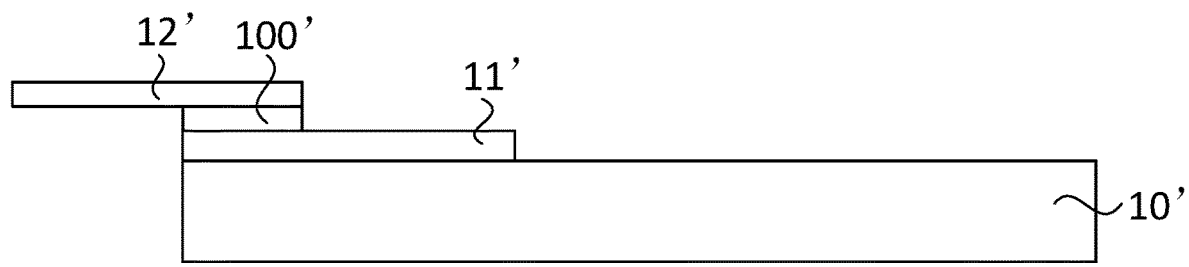
FIG. 2 is a cross-sectional view of FIG. 1 taken along a direction A-A'.

FIG. 1 is a diagram illustrating the structure of a display device in the related art. FIG. 2 is a cross-sectional view of FIG. 1 taken along a direction A-A'. As shown in FIG. 1 and FIG. 2, the display device includes a display assembly 10', an antenna 11', and a feed circuit board 12'. The antenna 11' and the feed circuit board 12' are disposed on one side of the light emission surface of the display assembly 10'. The feed circuit board 12' and the antenna 11' are bound by an ACF adhesive 100'.

Inventors have found through research that the preceding technical solutions have the following problems.

1. The feed circuit board 12' and the antenna 11' are electrically connected by conductive particles in the ACF adhesive 100' to perform feeding, so the feed circuit board 12' and the antenna 11' need to be configured on the same side of the display assembly 10'. The binding region of the feed circuit board 12' and the antenna 11' occupies the space of the bezel region on the side of the light emission surface of the display assembly 10'. This is not conducive to the implementation of a narrow bezel.
2. The ACF adhesive 100' has sparse conductive particles. When the feed circuit board 12' and the antenna 11' are bound by the ACF adhesive 100', the conductive particles need to be crushed through a hot pressing process to implement conduction. After hot pressing, part of the conductive particles in the ACF adhesive 100' are crushed, while another part of the conductive particles are not crushed, so the particle size difference between the conductive particles is relatively large. At the same time, the ACF adhesive 100' is relatively soft and cannot play a supporting role, resulting in the distance of the gap between the feed circuit board 12' and the antenna 11' in the bonding region becoming uneven with the uneven particle size distribution of the conductive particles. The uneven gap distance between the feed circuit board 12' and the antenna 11' in the bonding region causes the length of the transmission path of the radio frequency signal fed into each radiator in the antenna to be different. The signal (or signal intensity) received by each radiator is different (ideally, the signal received by each radiator should be consistent). Thus, the signal interference between the radiators is affected, the insertion loss is increased, and the overall performance of the antenna is affected.
3. When the ACF adhesive 100' is used for bonding, it is necessary to heat the metal in the antenna 11' to about 270° C. so that the metal in the antenna 11' is easily oxidized. At the same time, to ensure the electrical connection effect of the feed circuit board 12' and the antenna 11', it is necessary to increase the strength for press-fit during binding. The metal at the press-fit position is at risk of being crushed, thereby further deteriorating the uniformity of the gap distance between the feed circuit board 12' and the antenna 11' at the press-fit position. Moreover, since there is a difference between the coefficient of thermal expansion of the metal in the antenna 11' and the coefficient of thermal expansion of film layers adjacent to the metal, there is a risk of peeling off the antenna 11' when heating.

Based on the preceding technical problems, the embodiments of the present disclosure provide a display device. The display device includes a display assembly, an antenna, and a feed circuit board. At least part of the antenna is disposed on the side of the light emission surface of the display assembly. The antenna includes a radiator and a first feed structure connected to the radiator. The feed circuit board is disposed on the side of the display assembly facing away from the light emission surface. The feed circuit board includes a power division network and a second feed structure connected to the power division network. The first feed structure at least partially overlaps the second feed structure along the thickness direction of the display assembly.

According to the preceding technical solutions, at least part of the antenna is disposed on the side of the light emission surface of the display assembly to reduce signal interference, thereby improving the radiation performance of the antenna signal and solving the problem of poor radiation performance of the antenna signal. The feed circuit board is disposed on the side of the display assembly facing away from the light emission surface so that the space of the bezel region on the side of the light emission surface of the display assembly is prevented from being occupied by the feed circuit board bonding, thereby facilitating the implementation of a narrow bezel. At the same time, along the thickness direction of the display assembly, the first feed structure at least partially overlaps the second feed structure so that the coupling connection between the antenna and the feed circuit board is implemented. The transmission of the radio frequency signal between the antenna and the feed circuit board is ensured, and it does not need to implement the electrical connection by using the ACF adhesive for bonding, thereby ensuring the spacing uniformity between the antenna and the feed circuit board and reducing the insertion loss between the antenna and the feed circuit board. Moreover, heating is not required during the coupling connection between the antenna and the feed circuit board, thereby reducing the risk of peeling off the antenna.

The preceding is the core concept of the present disclosure, and the technical solutions in the embodiments of the present disclosure are described clearly and completely hereinafter in conjunction with the drawings in the embodiments of the present disclosure. Based on the embodiments of the present disclosure, all other embodiments obtained by those of ordinary skill in the art without creative work are within the protection scope of the present disclosure.

Figure 3:
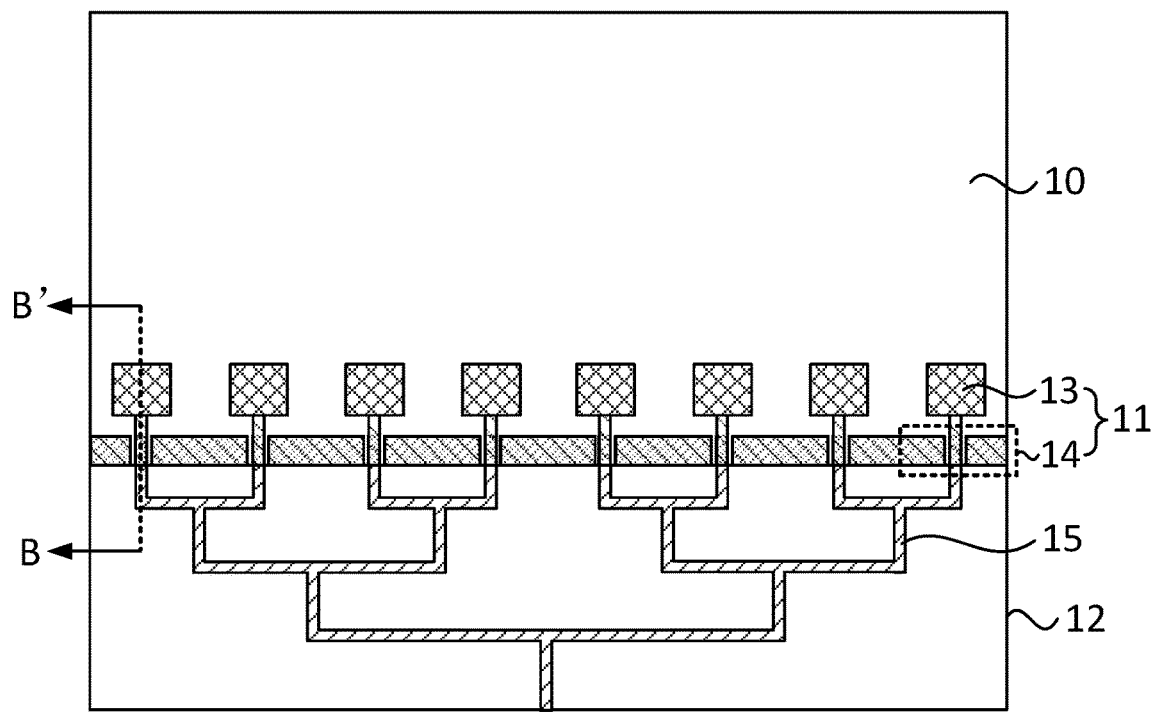
FIG. 3 is a diagram illustrating the structure of a display device according to the embodiments of the present disclosure.
Figure 4:
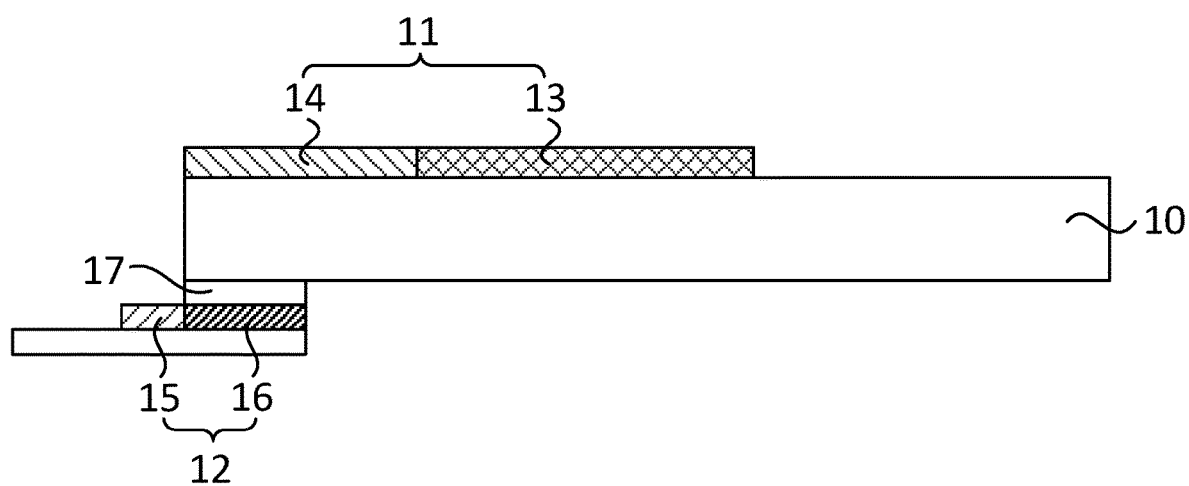
FIG. 4 is a cross-sectional view of FIG. 3 taken along a direction B-B'.
Figure 5:
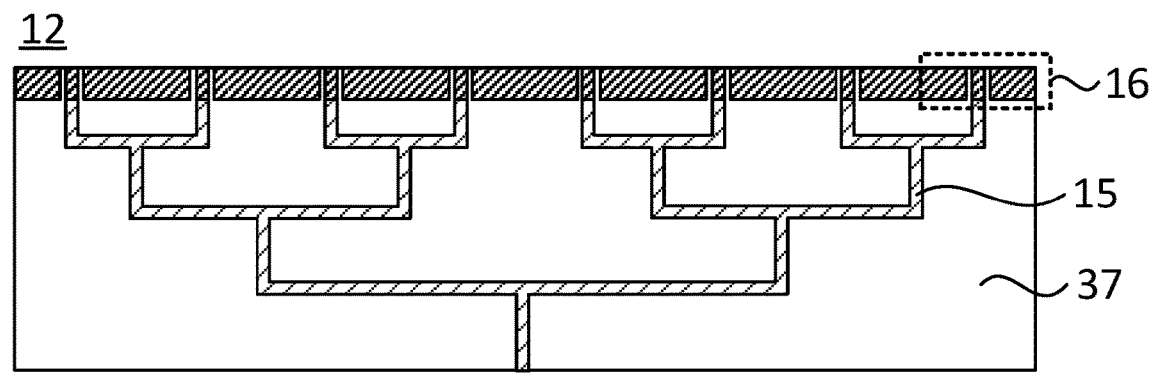
FIG. 5 is a diagram illustrating the structure of a feed circuit board according to the embodiments of the present disclosure.

FIG. 3 is a diagram illustrating the structure of a display device according to the embodiments of the present disclosure. FIG. 4 is a cross-sectional view of FIG. 3 taken along a direction B-B'. FIG. 5 is a diagram illustrating the structure of a feed circuit board according to the embodiments of the present disclosure. As shown in FIGS. 3 to 5, the display device provided in the embodiments of the present disclosure includes a display assembly 10, an antenna 11, and a feed circuit board 12. At least part of the antenna 11 is disposed on the side of the light emission surface of the display assembly 10. The antenna 11 includes radiators 13 and first feed structures 14 electrically connected to the radiators 13. The feed circuit board 12 is disposed on the side of the display assembly 10 facing away from the light emission surface. The feed circuit board 12 includes a power division network 15 and second feed structures 16 connected to the power division network 15. The first feed structures 14 at least partially overlap the second feed structures 16 along the thickness direction of the display assembly 10.

Specifically, as shown in FIG. 3 and FIG. 4, the display assembly 10 is used for implementing a display function. The display assembly 10 may include a display panel so that the display is directly performed, and both a low power consumption and a low cost are achieved. The display panel may be a liquid-crystal display (LCD), an organic light-emitting diode (OLED), a micro light emitting diode display (Micro LED Display), or a mini light-emitting diode (Mini LED). However, this is not limited thereto.

In other embodiments, the display assembly 10 may also include a backlight circuit. The brightness is regulated in partitions through the pixel circuit so that an image of bright state can have a higher brightness, and an image of dark state can approach zero brightness, thereby contributing to an increase in display effect. This is not specifically limited in the embodiments of the present disclosure.

Still referring to FIG. 3 and FIG. 4, the radiators 13 are used for receiving the radio frequency signals transmitted from the first feed structures 14 and radiating the radio frequency signals outwardly to implement the signal sending function of the antenna 11. At the same time, the radiators 13 are also used for receiving the radio frequency signals transmitted from the outside and transmitting the radio frequency signals to the first feed structures 14 to implement the signal receiving function of the antenna 11.

Still referring to FIG. 4, optionally, the antenna 11 is disposed on the side of the light emission surface of the display assembly 10. If the antenna is disposed on the side of the display assembly 10 facing away from the light emission surface, only the signal from the side of the display assembly 10 facing away from the light emission surface can be sent and received. When a user holds the device by hand, the signal interference is relatively large and the communication quality is affected. Especially for a display device such as a foldable screen, the signal radiation performance is further degraded. Therefore, in the embodiments, the antenna 11 is disposed on the side of the light emission surface of the display assembly 10 so that signal interference can be reduced to improve the signal radiation performance of the antenna 11 and solve the problem of poor signal radiation performance of the antenna 11.

It is to be noted that, in FIG. 3 and FIG. 4, only the whole antenna 11 disposed on the side of the light emission surface of the display assembly 10 is taken as an example. In other embodiments, only part of the antenna 11 may be disposed on the side of the light emission surface of the display assembly 10. This can also reduce signal interference and improve the signal radiation performance of the antenna 11.

Still referring to FIG. 5, the power division network 15 is used for transmitting a radio frequency signal to each second feed structure 16. The power division network 15 may be distributed in an arborescent shape and includes multiple branches. One branch provides a radio frequency signal for one second feed structure 16.

Still referring to FIG. 4, the feed circuit board 12 is disposed on the side of the display assembly 10 facing away from the light emission surface. Thus, the space of the bezel region on the side of the light emission surface of the display assembly 10 is not occupied, thereby facilitating the implementation of a narrow bezel and solving the problem of a wider bezel.

Further, as shown in FIG. 3 and FIG. 4, the antenna 11 and the feed circuit board 12 are located on different sides of the display assembly 10. The first feed structures 14 at least partially overlap the second feed structures 16 along the thickness direction of the display assembly 10 so that the coupling connection between the antenna 11 and the feed circuit board 12 is implemented. Thus, coupled feed between the antenna 11 and the feed circuit board 12 is implemented, and transmission of the radio frequency signal between the antenna 11 and the feed circuit board 12 is ensured.

According to the preceding technical solutions, the following technical effects can be implemented.

1. The antenna 11 and the feed circuit board 12 are coupled. The antenna 11 and the feed circuit board 12 are not in contact with each other, that is, a direct electrical connection is not required between the antenna 11 and the feed circuit board 12. Therefore, the electrical connection is not required to be implemented through the ACF adhesive bonding so that there is no problem that the particle size of the conductive particles in the ACF adhesive is uneven after being pressed. Moreover, the antenna 11 and the feed circuit board 12 are located on different sides of the display assembly 10. The display assembly 10 between the antenna 11 and the feed circuit board 12 has good thickness uniformity, thereby further ensuring the spacing uniformity between the antenna 11 and the feed circuit board 12, reducing the insertion loss between the antenna 11 and the feed circuit board 12, and solving the problem of large insertion loss.
2. Since the preceding solutions do not need to implement the electrical connection through the ACF adhesive for bonding, when the antenna 11 and the feed circuit board 12 are coupled, heating is not required. Thus, the risk of peeling off the antenna 11 from the carrier film layer thereof is reduced, and the problem that the antenna 11 is easy to be peeled off in the existing heating process is solved.

In summary, in the display device provided in the embodiments of the present disclosure, at least part of the antenna is disposed on the side of the light emission surface of the display assembly to reduce signal interference, thereby improving the radiation performance of the antenna signal and solving the problem of poor radiation performance of the antenna signal. The feed circuit board is disposed on the side of the display assembly facing away from the light emission surface so that the space of the bezel region on the side of the light emission surface of the display assembly is prevented from being occupied by the feed circuit board bonding, thereby facilitating the implementation of a narrow bezel. At the same time, the first feed structures at least partially overlap the second feed structures along the thickness direction of the display assembly so that the coupling connection between the antenna and the feed circuit board is implemented. The transmission of the radio frequency signal between the antenna and the feed circuit board is ensured, and it does not need to implement the electrical connection by using the ACF adhesive bonding, thereby ensuring the spacing uniformity between the antenna and the feed circuit board and reducing the insertion loss between the antenna and the feed circuit board. Moreover, heating is not required during the coupling connection between the antenna and the feed circuit board, thereby reducing the risk of peeling off the antenna.

Still referring to FIG. 4, optionally, the display device provided in the embodiments of the present disclosure also includes an adhesive layer 17. The adhesive layer 17 is disposed between the feed circuit board 12 and the display assembly 10. The adhesive layer 17 is in contact with the feed circuit board 12 and the display assembly 10 and the adhesive layer 17 is connected to the feed circuit board 12 and the display assembly 10.

Specifically, the feed circuit board 12 is fixed to the surface of the side of the display assembly 10 facing away from the light emission surface by the adhesive layer 17.

The adhesive layer 17 may be made of an insulation material without the use of an ACF adhesive, thereby ensuring the spacing uniformity between the antenna 11 and the feed circuit board 12, reducing the insertion loss between the antenna 11 and the feed circuit board 12, and helping to improve the performance of the antenna 11. At the same time, in the process of securing the feed circuit board 12, heating is not required, thereby reducing the risk of peeling off the metal on the feed circuit board 12.

Optionally, the hardness of the adhesive layer 17 is greater than or equal to the hardness of an optically clear adhesive.

Specifically, the adhesive layer 17 can be set to have a high hardness to play a certain supporting role and have good thickness uniformity. Thus, the spacing uniformity between the antenna 11 and the feed circuit board 12 can be improved.

It is to be noted that the optically clear adhesive refers to an OCA adhesive.

The adhesive layer 17 may use any one of an optically clear adhesive (OCA), optical clear resin (OCR), or a seal to have a high hardness and good thickness uniformity. However, this is not limited thereto.

Exemplarily, when the adhesive layer 17 uses the OCA, the OCA can be directly adhered to the surface of the side of the display assembly 10 facing away from the light emission surface. Then, the feed circuit board 12 is pressed on the OCA. The process is simple and easy to implement.

The seal includes a UV adhesive or a heat curing seal. When the adhesive layer 17 uses a UV adhesive, the feed circuit board 12 and the display assembly 10 can be adhered through UV curing. When the adhesive layer 17 uses a heat curing seal, the feed circuit board 12 and the display assembly 10 can be adhered through heat curing. The temperature of heat curing (about 200° C.) is much lower than the heating temperature of the ACF adhesive.

When the adhesive layer 17 uses a semi-curing adhesive such as an OCR or a liquid optically clear adhesive, the feed circuit board 12 and the display assembly 10 can be adhered by using a coating process. The process is simple and easy to implement.

Optionally, the adhesive layer 17 includes an inorganic layer.

Specifically, the adhesive layer 17 may be an inorganic layer. The inorganic material has good radio frequency signal transmission performance. Therefore, by securing the feed circuit board 12 to the surface of the side of the display assembly 10 facing away from the light emission surface through the inorganic layer, the signal loss can be reduced, and the performance of the antenna 11 can be improved.

The inorganic layer may include a SiN layer, a SiO layer, or a stacked structure of a SiN layer and a SiO layer. The inorganic layer has a mature preparation process and a good density so that the inorganic layer can have a high hardness and good thickness uniformity. However, this is not limited thereto.

Further, when the adhesive layer 17 is an inorganic layer, the inorganic layer can be printed on the surface of the side of the display assembly 10 facing away from the light emission surface by using a screen printing method. Then, the feed circuit board 12 is pressed on the inorganic layer. The process is simple and easy to implement.

In other embodiments, the chemical vapor deposition (CVD) process may be used to prepare an inorganic layer on the side of the display assembly 10 facing away from the light emission surface. The inorganic layer can be welded to the feed circuit board 12 through ultrasonic welding. The process is mature and easy to implement. However, this is not limited thereto.

Figure 6:
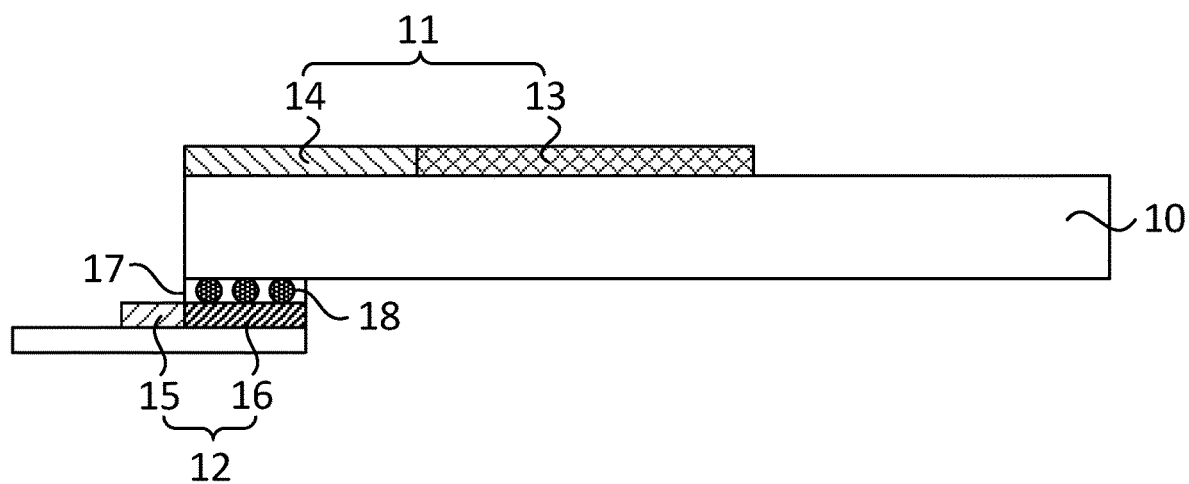
FIG. 6 is a partial cross-sectional view illustrating the structure of a display device according to the embodiments of the present disclosure.

FIG. 6 is a partial cross-sectional view illustrating the structure of a display device according to the embodiments of the present disclosure. As shown in FIG. 6, optionally, support structures 18 are disposed in the adhesive layer 17. The density of the support structures 18 is greater than that of the adhesive layer 17.

Specifically, the support structures 18 have a larger density so that the support structures 18 can play a good supporting role and implement good thickness uniformity. Therefore, by adding the support structures 18 having a larger density to the adhesive layer 17, the thickness uniformity of the adhesive layer 17 can be further increased, thereby ensuring the spacing uniformity between the antenna 11 and the feed circuit board 12, reducing the insertion loss between the antenna 11 and the feed circuit board 12, and helping to increase the gain of the antenna 11.

It is to be noted that in the process of configuring the support structures 18 in the adhesive layer 17, if the adhesive layer 17 uses a liquid adhesive, the support structures 18 may be directly mixed in the liquid adhesive. If the adhesive layer 17 uses a solid adhesive such as an OCA, the support structures 18 may be sprayed on the colloidal surface of the solid adhesive. However, this is not limited thereto.

Still referring to FIG. 6, optionally, each support structure 18 is a spherical structure.

Specifically, by setting the shape of each support structure 18 to be spherical, it is possible to prevent the each support structure 18 from affecting the thickness uniformity of the adhesive layer 17 due to different postures in the adhesive layer 17.

The support structure 18 may include a silicon ball or a ball spacer (BS) of a resin material to achieve good thickness uniformity. However, this is not limited thereto.

In other embodiments, those skilled in the art can select the support structure 18 with particle size dispersity within 5% to achieve good thickness uniformity.

Figure 7:
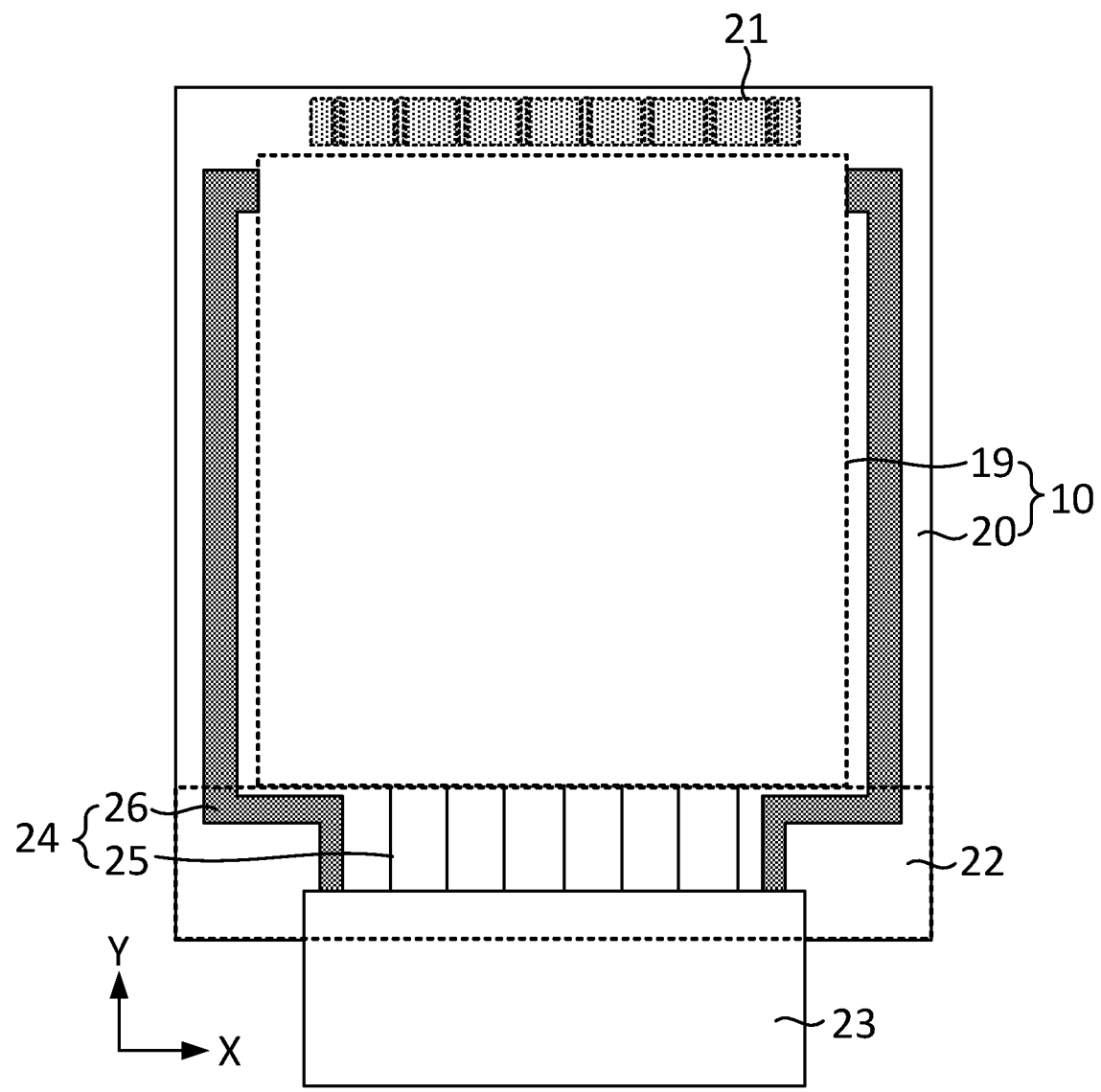
FIG. 7 is a diagram illustrating the structure of another display device according to the embodiments of the present disclosure.
Figure 8:
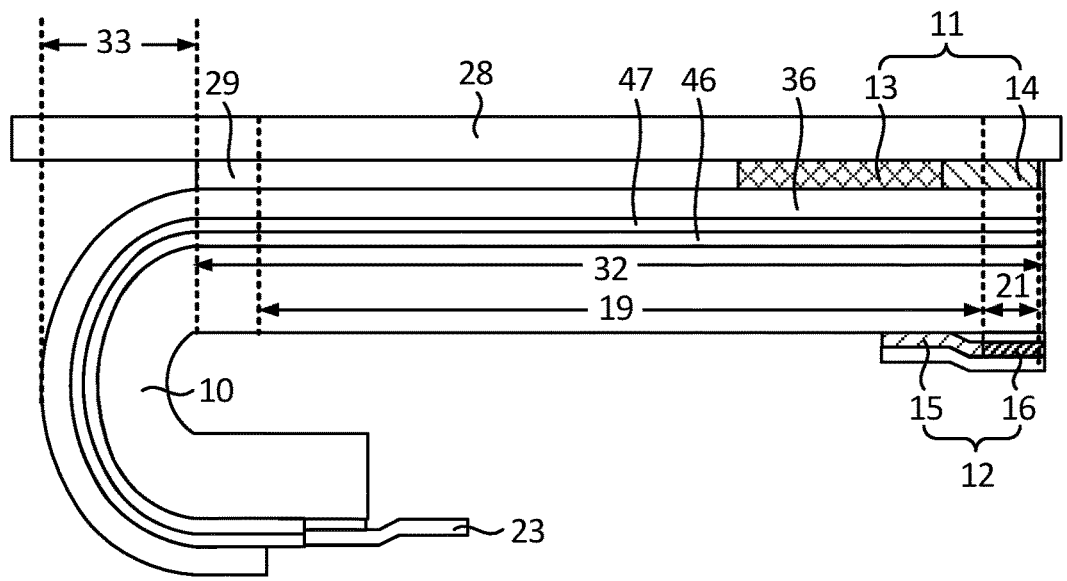
FIG. 8 is a cross-sectional view illustrating the structure of another display device according to the embodiments of the present disclosure.

FIG. 7 is a diagram illustrating the structure of another display device according to the embodiments of the present disclosure. FIG. 8 is a cross-sectional view illustrating the structure of another display device according to the embodiments of the present disclosure. As shown in FIG. 7 and FIG. 8, optionally, a display assembly 10 includes a display region 19 and a non-display region 20 disposed around the display region 19. The overlapping region 21 of a first feed structure 14 and a second feed structure 16 is located in the non-display region 20.

Exemplarily, as shown in FIG. 7 and FIG. 8, the display region 19 of the display assembly 10 is provided with multiple sub-pixels (not shown) arranged in an array. The sub-pixels are correspondingly provided with pixel driver circuits (not shown). The pixel driver circuits are used for driving the sub-pixels to emit light to implement a display function. The pixel driver circuits are densely arranged to have higher resolution and implement high-definition display.

It is to be understood that when coupled feed is performed between an antenna 11 and a feed circuit board 12, the radio frequency signal is transmitted in the display assembly 10 in the overlapping region 21 of the first feed structure 14 and the second feed structure 16. In the embodiments, the overlapping region 21 of the first feed structure 14 and the second feed structure 16 is disposed in the non-display region 20 so that the first feed structure 14 and the second feed structure 16 are coupled and fed in the non-display region 20. At the same time, the radio frequency signal is transmitted in the non-display region 20 of the display assembly 10. There are no densely arranged pixel driver circuits between the first feed structure 14 and the second feed structure 16, thereby preventing the coupling of the radio frequency signal from being interfered by the metals in the pixel driver circuits, helping to reduce the insertion loss and increasing the overall gain of the antenna 11.

In the embodiments, the overlapping region 21 may be located at any position in the non-display region 20, that is, the overlapping region 21 may be disposed in the non-display region 20 on any side of the display region 19. It is to be understood that as long as the overlapping region 21 is not disposed in the display region 19, the pixel driver circuits in the display region 19 can be avoided. Those skilled in the art may set according to actual requirements.

It is to be noted that in FIG. 7 and FIG. 8, the display assembly 10 being a flexible display assembly is taken as an example. To more clearly illustrate the structure of each component in the display device, FIG. 7 shows the structure diagram of the display assembly 10 when the display assembly 10 is unfolded, and FIG. 8 shows the structure diagram of the display assembly 10 when the display assembly 10 is bent. However, this is not limited thereto.

In addition, as described above, FIG. 7 and FIG. 8 only take the display assembly 10 as a flexible display assembly for example. It is to be understood that the solutions provided in the embodiments can also be applicable when the display assembly 10 is a rigid display assembly.

Meanwhile, to more clearly show positions of overlapping regions 21 of first feed structures 14 and second feed structures 16, only the overlapping regions 21 are shown in FIG. 7, and the first feed structures 14 and the second feed structures 16 are not shown. This does not constitute a limitation on the protection scope of the present disclosure.

Still referring to FIG. 7 and FIG. 8, optionally, the non-display region 20 includes a step wiring region 22. The step wiring region 22 is located on one side of the display region 19. The overlapping regions 21 of the first feed structures 14 and the second feed structures 16 are located outside the step wiring region 22.

Exemplarily, as shown in FIG. 7 and FIG. 8, the non-display region 20 on one side of the display region 19 is set as the step wiring region 22. In the display region 19, signal lines which provide required drive signals for pixel driver circuits extend to the step wiring region 22. The display circuit board 23 of the display device is bound to the step wiring region 22. A display driver chip provides a corresponding drive signal for each signal line in the step wiring region 22 through the display circuit board 23. Since a large number of signal lines in the display region 19 need to extend to the step wiring region 22 to receive the drive signal transmitted from the display circuit board 23, the step wiring region 22 is provided with dense wires. Therefore, the overlapping regions 21 of the first feed structures 14 and the second feed structures 16 are disposed in a region outside the step wiring region 22 so that the coupling transmission of the radio frequency signals between the first feed structures 14 and the second feed structures 16 is not interfered by the dense wires, thereby helping to reduce the insertion loss and increase the gain of the antenna 11.

It is to be noted that in the embodiments, the overlapping regions 21 may be located at any position in the non-display region 20 excluding the step wiring region 22. It is to be understood that as long as the overlapping regions 21 of the first feed structures 14 and the second feed structures 16 do not overlap the step wiring region 22 along the thickness direction of the display assembly 10, the dense wires in the step wiring region 22 can be avoided. Those skilled in the art may set according to actual requirements.

In addition, as described above, FIG. 7 and FIG. 8 only take the display assembly 10 as a flexible display assembly for example. It is to be understood that the solutions provided in the embodiments can also be applicable when the display assembly 10 is a rigid display assembly.

Still referring to FIG. 7 and FIG. 8, optionally, the overlapping regions 21 of the first feed structures 14 and the second feed structures 16 are located at the side of the display region 19 facing away from the step wiring region 22.

Specifically, as shown in FIG. 7 and FIG. 8, the wires in the display region 19 which are far away from the step wiring region 22 can extend to the step wiring region 22 through the non-display region 20 at left and right sides of the display region 19. Therefore, there are some wires in the non-display region 20 at the left and right sides of the display region 19. In the embodiments, the overlapping region 21 of the first feed structures 14 and the second feed structures 16 are disposed to locate at the side of the display region 19 facing from the step wiring region 22. Thus, the display assembly 10 between the first feed structures 14 and the second feed structures 16 can have fewer wires, thereby reducing the influence of the wires in the display assembly 10 on the transmission of the radio frequency signals between the first feed structures 14 and the second feed structures 16, and helping to reduce the insertion loss and increase the gain of the antenna 11.

Figure 9:
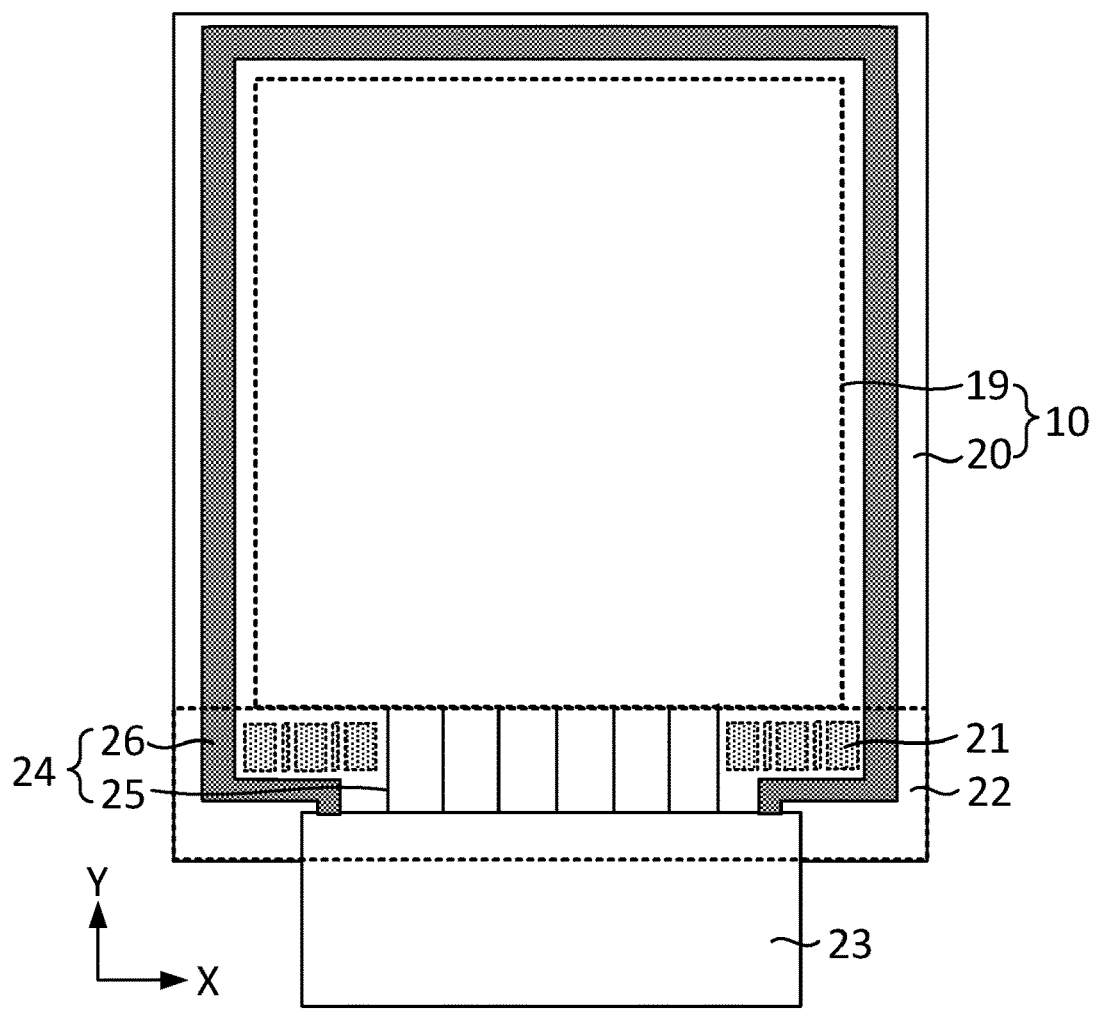
FIG. 9 is a diagram illustrating the structure of another display device according to the embodiments of the present disclosure.
Figure 10:
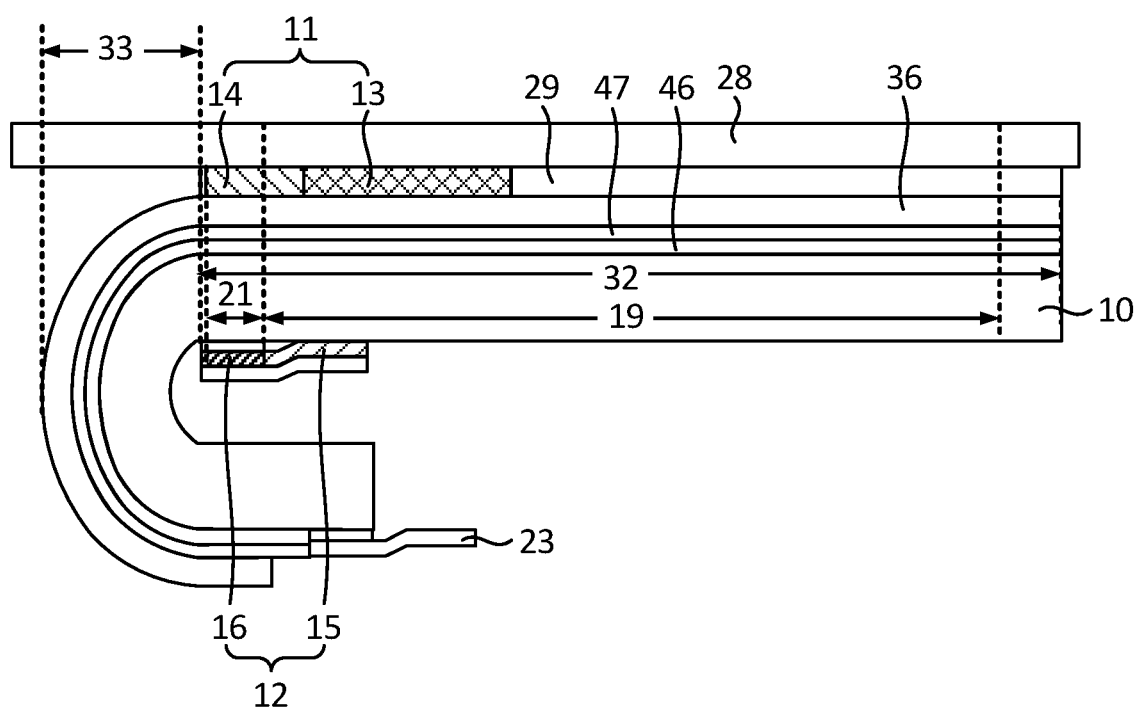
FIG. 10 is a cross-sectional view illustrating the structure of another display device according to the embodiments of the present disclosure.

FIG. 9 is a diagram illustrating the structure of another display device according to the embodiments of the present disclosure. FIG. 10 is a cross-sectional view illustrating the structure of another display device according to the embodiments of the present disclosure. As shown in FIG. 9 and FIG. 10, optionally, a non-display region 20 includes a step wiring region 22. The step wiring region 22 is located on one side of a display region 19. The step wiring region 22 is provided with multiple signal transmission lines 24. The overlapping regions 21 of first feed structures 14 and second feed structures 16 are located in the step wiring region 22. There are gaps between the overlapping regions 21 of the first feed structures 14 and the second feed structures 16 and the signal transmission lines 24.

Specifically, as shown in FIGS. 7 to 10, the step wiring region 22 is provided with multiple signal transmission lines 24. In the display region 19, the signal lines in which the required drive signals are provided for pixel driver circuits extend to the step wiring region 22, and the signal lines are bound and connected to a display circuit board 23 through the multiple signal transmission lines 24 in the step wiring region 22. A display driver chip provides corresponding drive signals for the signal transmission lines 24 in the step wiring region 22 through the display circuit board 23.

Further, as shown in FIG. 9 and FIG. 10, in the embodiments, the overlapping regions 21 of the first feed structures 14 and the second feed structures 16 are disposed in the step wiring region 22. Gaps exist between the overlapping regions 21 of the first feed structures 14 and the second feed structures 16 and the signal transmission lines 24. That is, the overlapping regions 21 of the first feed structures 14 and the second feed structures 16 do not overlap the signal transmission lines 24 along the thickness direction of the display assembly 10. Thus, the coupling transmission of the radio frequency signals between the first feed structures 14 and the second feed structures 16 is not interfered by the signal transmission lines 24 in the step wiring region 22, thereby helping to reduce the insertion loss and increase the gain of the antenna 11.

In the embodiments, as long as it is ensured that the signal transmission lines 24 in the step wiring region 22 do not overlap the overlapping regions 21, the overlapping regions 21 may be located at any position in the step wiring region 22 to avoid the signal transmission lines 24 in the display assembly 10. Those skilled in the art may set according to actual requirements.

It is to be noted that in FIG. 9 and FIG. 10, the display assembly 10 being a flexible display assembly is taken as an example. To more clearly illustrate the structure of each component in the display device, FIG. 9 shows the structure diagram of the display assembly 10 when the display assembly 10 is unfolded, and FIG. 10 shows the structure diagram of the display assembly 10 when the display assembly 10 is bent. However, this is not limited thereto.

Meanwhile, to more clearly show the positions of the overlapping regions 21 of the first feed structures 14 and the second feed structures 16, only the overlapping regions 21 are shown in FIG. 9, and the first feed structures 14 and the second feed structures 16 are not shown. This does not constitute a limitation on the protection scope of the present disclosure.

Still referring to FIG. 9 and FIG. 10, optionally, the signal transmission lines 24 include multiple first signal lines 25 and multiple second signal lines 26. The first signal lines 25 are arranged along a first direction X and extend along a second direction Y. The second signal lines 26 are arranged along the first direction X and extend along the second direction Y. The second signal lines 26 are located at at least one side of the first signal lines 25 along the first direction X. Along the first direction X, the overlapping regions 21 of the first feed structures 14 and the second feed structures 16 are located between the first signal lines 25 and the second signal lines 26, or the overlapping regions 21 of the first feed structures 14 and the second feed structures 16 are located at the sides of the second signal lines 26 facing away from the first signal lines 25.

Specifically, as shown in FIGS. 7 to 10, the signal transmission lines 24 include multiple first signal lines 25 and multiple second signal lines 26 extending along the second direction Y. The second signal lines 26 are located at at least one side of the first signal lines 25. FIG. 7 and FIG. 9 only take that the second signal lines 26 are located at both sides of the first signal lines 25 as an example. However, this is not limited thereto.

The first signal lines 25 may be data signal transmission lines to provide data signals for data lines in the display region 19. The second signal lines 26 may be scan signal transmission signal lines to provide scan signals for scan signal lines in the display region 19. In other embodiments, the first signal lines 25 may be scan signal transmission signal lines, and the second signal lines 26 may be data signal transmission lines. However, this is not limited thereto. Those skilled in the art may set according to actual requirements.

Still referring to FIG. 9, the overlapping regions 21 of the first feed structures 14 and the second feed structures 16 are configured to be located between the first signal lines 25 and the second signal lines 26. The overlapping regions 21 of the first feed structures 14 and the second feed structures 16 do not overlap the signal transmission lines 24 along the thickness direction of the display assembly 10. Thus, the coupling transmission of the radio frequency signals between the first feed structures 14 and the second feed structures 16 is not interfered by the first signal lines 25 and the second signal lines 26 in the step wiring region 22, thereby helping to reduce the insertion loss and increase the gain of the antenna 11.

Figure 11:
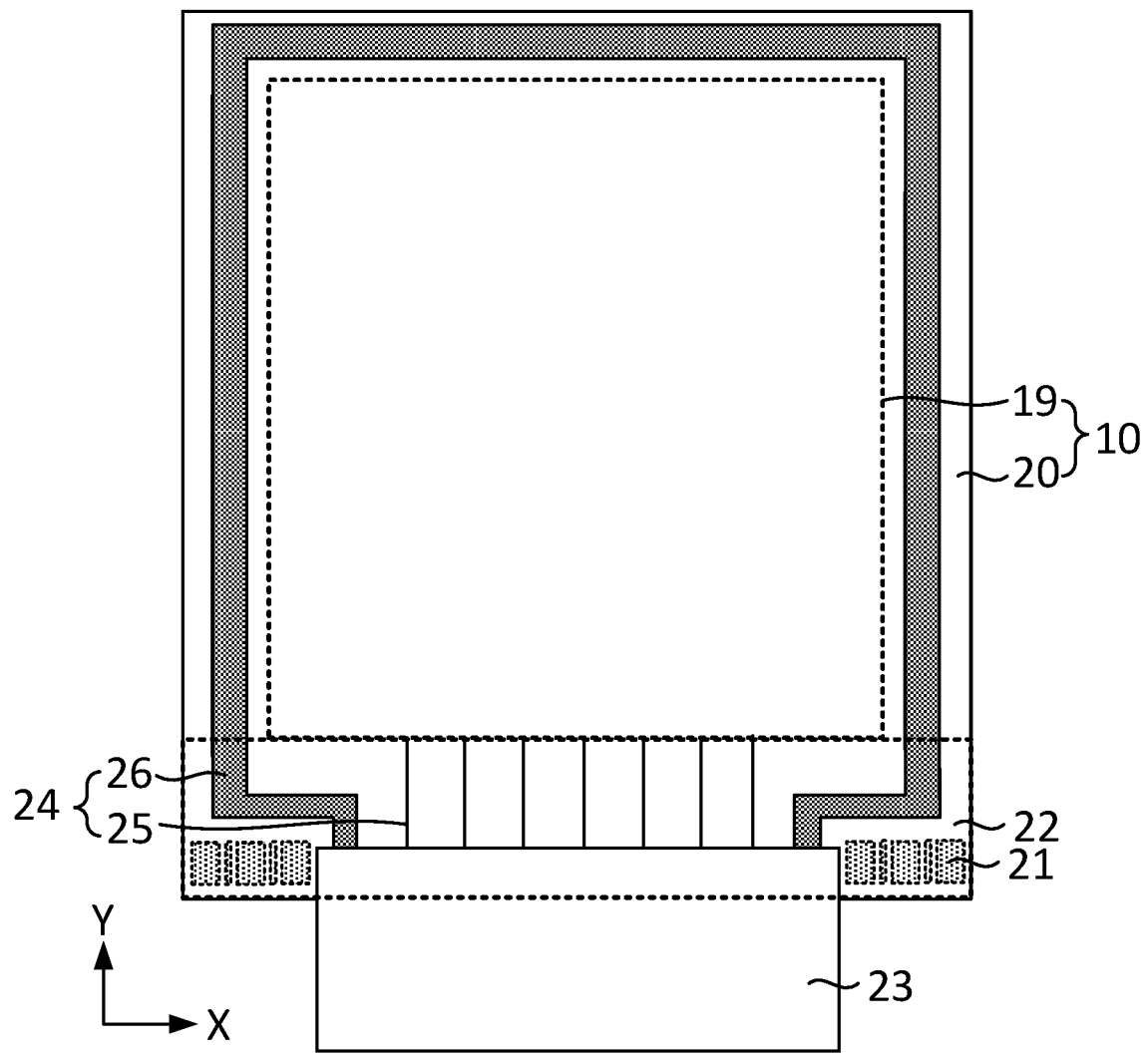
FIG. 11 is a diagram illustrating the structure of another display device according to the embodiments of the present disclosure.

FIG. 11 is a diagram illustrating the structure of another display device according to the embodiments of the present disclosure. As shown in FIG. 11, optionally, the overlapping regions 21 of first feed structures 14 and second feed structures 16 may be disposed at the sides of second signal lines 26 facing away from first signal lines 25. The overlapping regions 21 of the first feed structures 14 and the second feed structures 16 do not overlap signal transmission lines 24 along the thickness direction of a display assembly 10. Thus, the coupling transmission of the radio frequency signals between the first feed structures 14 and the second feed structures 16 is not interfered by the first signal lines 25 and the second signal lines 26 in a step wiring region 22, thereby helping to reduce the insertion loss and increase the gain of an antenna 11.

Figure 12:
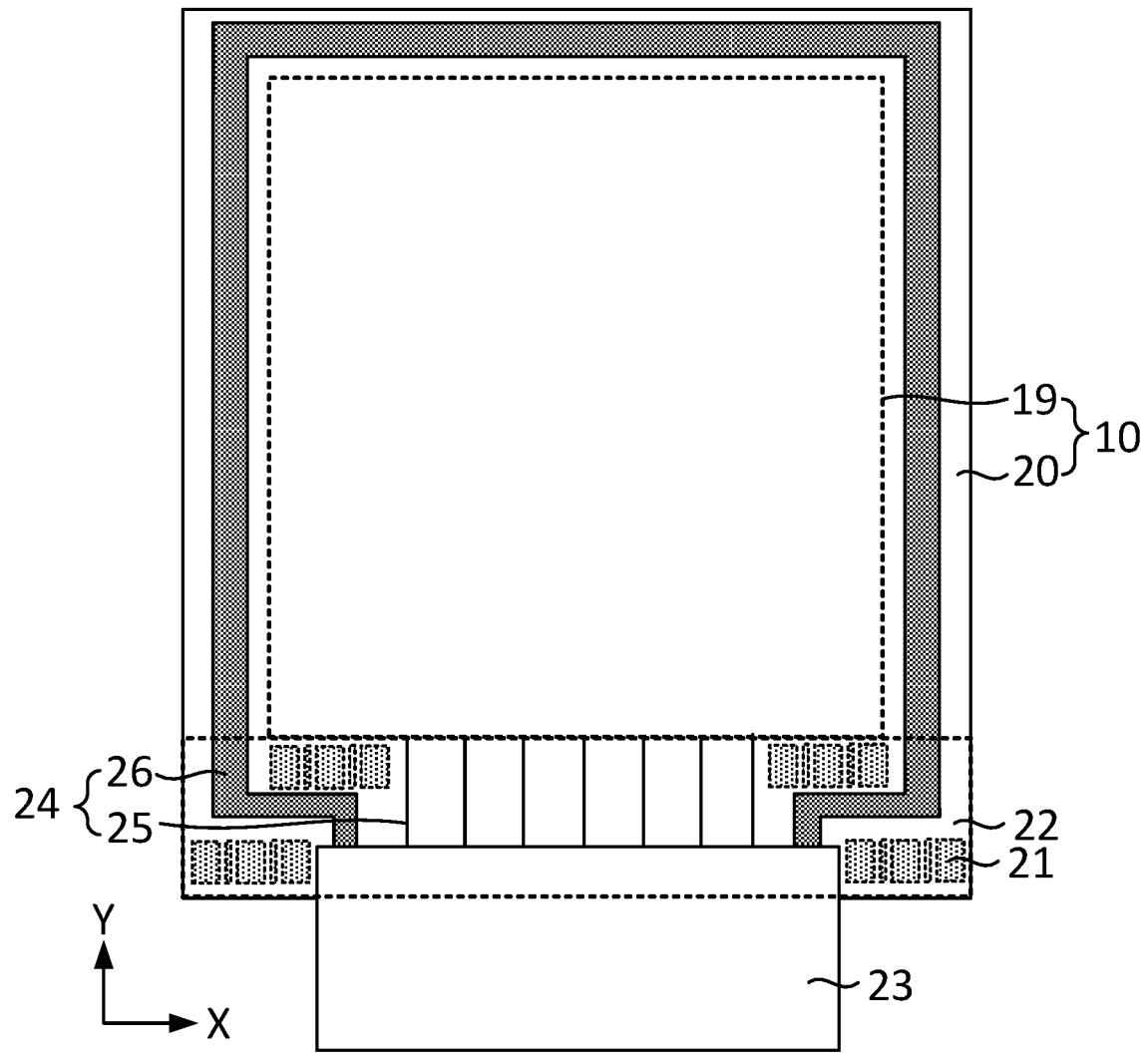
FIG. 12 is a diagram illustrating the structure of another display device according to the embodiments of the present disclosure.

FIG. 12 is a diagram illustrating the structure of another display device according to the embodiments of the present disclosure. As shown in FIG. 12, optionally, the overlapping regions 21 of first feed structures 14 and second feed structures 16 may be disposed between first signal lines 25 and second signal lines 26 and at the sides of the second signal lines 26 facing away from the first signal lines 25 at the same time. The overlapping regions 21 of the first feed structures 14 and the second feed structures 16 do not overlap signal transmission lines 24 along the thickness direction of a display assembly 10. Thus, the coupling transmission of the radio frequency signals between the first feed structures 14 and the second feed structures 16 is not interfered by the first signal lines 25 and the second signal lines 26 in a step wiring region 22, thereby helping to reduce the insertion loss and increase the gain of an antenna 11.

It is to be noted that in the embodiments, as long as the overlapping regions 21 of the first feed structures 14 and the second feed structures 16 do not overlap the first signal lines 25 and the second signal lines 26 in the step wiring region 22, the overlapping regions 21 may be located at any position in the step wiring region 22 to avoid the first signal lines 25 and the second signal lines 26 in the display assembly 10. Those skilled in the art may set according to actual requirements.

Figure 13:
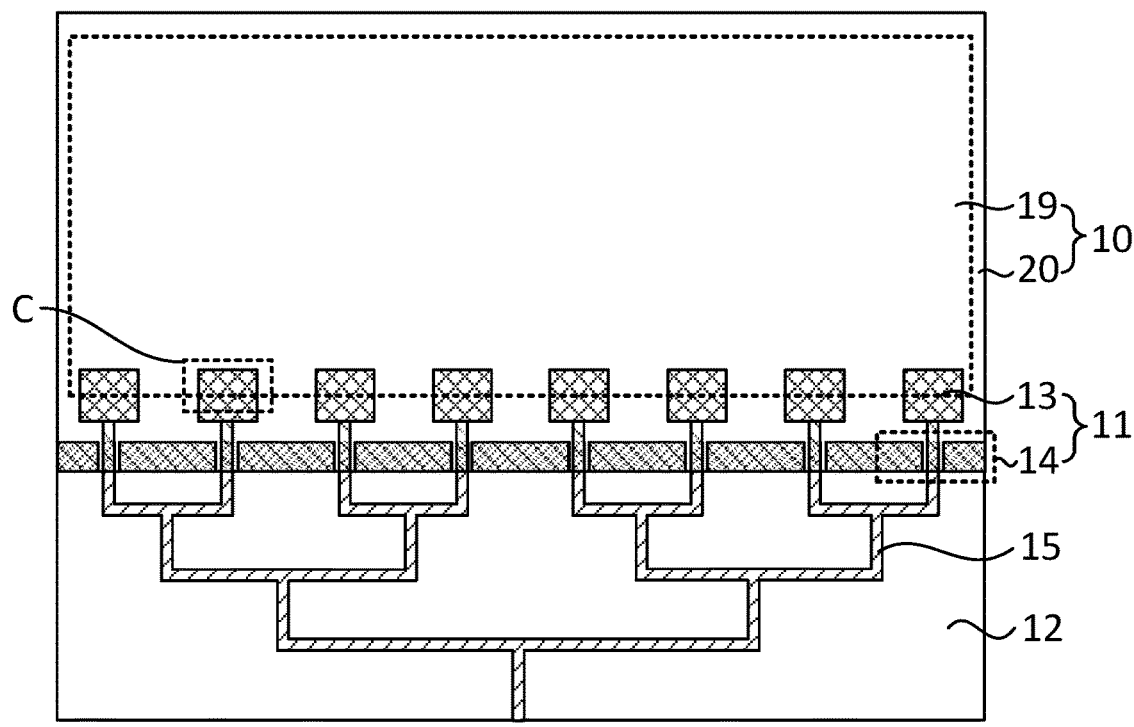
FIG. 13 is a diagram illustrating the structure of another display device according to the embodiments of the present disclosure.

FIG. 13 is a diagram illustrating the structure of another display device according to the embodiments of the present disclosure. As shown in FIG. 13, optionally, a display assembly 10 includes a display region 19 and a non-display region 20 around the display region 19. An antenna 11 includes radiators 13. At least part of radiators 13 are located in the display region 19.

Specifically, as shown in FIG. 13, at least part of the radiators 13 are located in the display region 19. Thus, it is not necessary to dispose a wide non-display region 20 on the side of the light emission surface of the display assembly 10 to dispose the radiators 13, thereby helping to reduce the area of the non-display region 20 and increasing the screen-to-body ratio.

At the same time, at least part of the radiators 13 are located in the display region 19 so that the setting area of the radiators 13 can be larger. Thus, the signal transceiving range of the antenna 11 is larger, helping to improve the communication quality.

It is to be noted that FIG. 13 is only an example in which part of the radiators 13 are located in the display region 19. However, this is not limited thereto.

Figure 14:
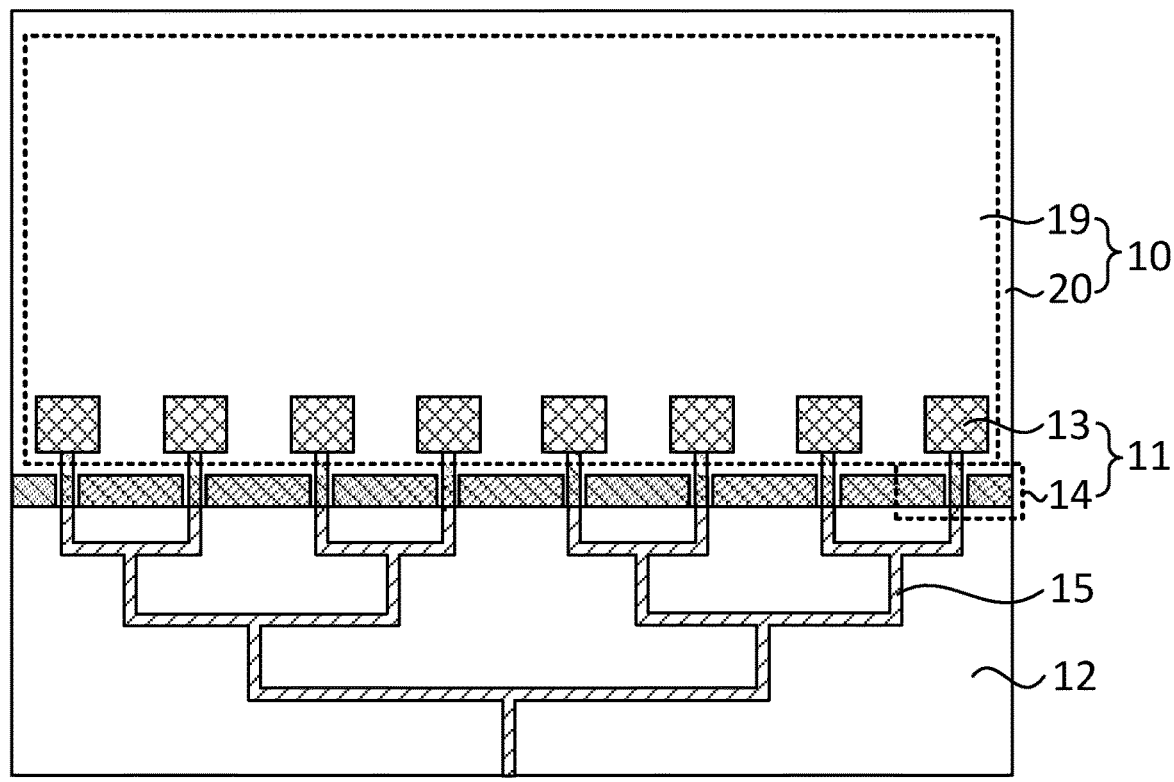
FIG. 14 is a diagram illustrating the structure of another display device according to the embodiments of the present disclosure.

FIG. 14 is a diagram illustrating the structure of another display device according to the embodiments of the present disclosure. As shown in FIG. 14, all of radiators 13 may be disposed to locate in a display region 19. Those skilled in the art may set according to actual requirements.

In addition, in other embodiments, all of radiators 13 may be disposed in a non-display region 20 to prevent the radiators 13 from affecting the display effect of a display region 19. Those skilled in the art may set according to actual requirements.

Optionally, the radiators 13 located in the display region 19 are made of a transparent conductive material.

Specifically, the radiators 13 in the display region 19 are made of a transparent conductive material. Thus, it is possible to prevent the radiators 13 from shielding the display region 19 when the signal transceiving of radiators 13 are ensured, thereby reducing the influence of the radiators 13 on the display effect of the display region 19.

The material of the radiators 13 may be a transparent material such as indium tin oxide (ITO) or indium zinc oxide (IZO) to implement the light-transmissive effect. However, this is not limited thereto. Those skilled in the art may set according to actual requirements.

Figure 15:
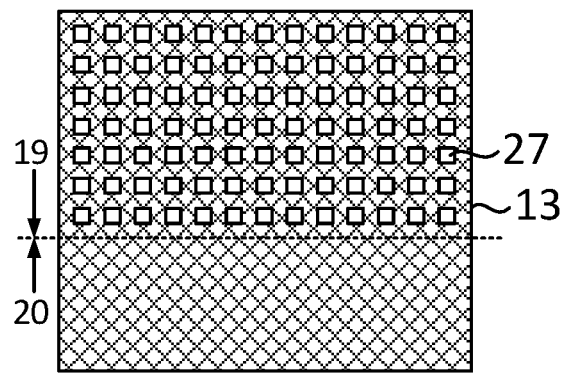
FIG. 15 is an enlarged view of FIG. 13 at C.

FIG. 15 is an enlarged view of FIG. 13 at C. As shown in FIG. 15, optionally, a radiator 13 located in the display region 19 is a mesh structure.

Specifically, as shown in FIG. 15, the radiator 13 located in the display region 19 may be a mesh structure. The mesh structure includes mesh holes 27. The mesh holes 27 have the function of light transmission, thereby reducing the shielding area of the radiator 13 to the display region 19 and reducing the influence of the radiator 13 on the display effect of the display region 19.

Since the mesh holes 27 have the function of light transmission, the material of the radiator 13 may be a metal material such as silver alloy, copper, molybdenum, gold, silver, or aluminum. Thus, a smaller sheet resistance can be obtained, the insertion loss on the radiator 13 can be reduced, and the gain of the antenna 11 can be increased.

It is to be noted that, in the mesh structure, the sizes and the setting density of the mesh holes 27 can be set in combination with the transmittance requirements of the radiator 13 and the performance requirements of the antenna 11. This is not specifically limited in the embodiments of the present disclosure.

In addition, the display region 19 is provided with a black matrix. The black matrix is disposed between adjacent sub-pixels to shield metal wires between adjacent sub-pixels to prevent the reflection of the metal wires from affecting the display effect. In the embodiments, the mesh structure may be disposed corresponding to the black matrix. That is, the mesh holes 27 of the mesh structure cover sub-pixels to prevent the mesh structure from shielding the sub-pixels, thereby reducing the influence of the radiator 13 on the display effect of the display region 19. However, this is not limited thereto.

In other embodiments, the mesh structure may be disposed without corresponding to the black matrix to reduce the process difficulty for preparing the mesh structure. This is easy to implement. Those skilled in the art may set according to actual requirements.

Still referring to FIG. 8 and FIG. 10, optionally, the display device provided in the embodiments of the present disclosure also includes a protection structure 28. The protection structure 28 is disposed on the side of the antenna 11 facing away from the display assembly 10.

Specifically, as shown in FIG. 8 and FIG. 10, by configuring the protection structure 28 on the side of the antenna 11 facing away from the display assembly 10, the protection structure 28 can cover the antenna 11 and the display assembly 10 along the thickness direction of the display assembly 10 to protect the antenna 11 and the display assembly 10.

The protection structure 28 may be a glass cover plate to achieve a high transmittance and a high hardness. However, this is not limited thereto.

Still referring to FIG. 8 and FIG. 10, optionally, the protection structure 28 is in contact with and connected to the antenna 11.

Specifically, when the antenna 11 is configured, the antenna 11 can be directly prepared on the protection structure 28 so that the protection structure 28 is in contact with and connected to the antenna 11. The antenna 11 is supported by the protection structure 28. An additional support layer does not need to be prepared to support the antenna 11. Thus, the thickness of the display device can be reduced, thereby helping to implement a light and thin design.

Further, as shown in FIG. 8 and FIG. 10, after the antenna 11 is disposed on the protection structure 28, the protection structure 28 on which the antenna 11 is prepared can be adhered to the display assembly 10 by a first joint adhesive 29. However, this is not limited thereto.

The first joint adhesive 29 may use an optically clear adhesive (OCA), optical clear resin (OCR), or the like to have a high transmittance and reduce the influence on the display effect of the display region 19. However, this is not limited thereto.

Still referring to FIG. 8 and FIG. 10, optionally, the protection structure 28 is a rigid protection structure.

By configuring the protection structure 28 as a rigid protection structure, the protection structure 28 can have a high hardness to better play a protective role.

At the same time, the protection structure 28 is a rigid protection structure. It is also advantageous to dispose the antenna 11 directly on the protection structure 28. Thus, an additional support layer does not need to be prepared to support the antenna 11, and the thickness of the display device is reduced, thereby helping to implement a light and thin design.

Optionally, the antenna 11 is in contact with and connected to the display assembly 10.

Specifically, when the antenna 11 is configured, the antenna 11 can be directly prepared on the display assembly 10 so that the display assembly 10 is in contact with and connected to the antenna 11. The antenna 11 is supported by the display assembly 10. An additional support layer does not need to be prepared to support the antenna 11. Thus, the thickness of the display device can be reduced, thereby helping to implement a light and thin design.

Further, as shown in FIG. 8 and FIG. 10, after the antenna 11 is disposed on the display assembly 10, the protection structure 28 can be adhered to the display assembly 10 by the first joint adhesive 29 to protect the antenna 11 on the display assembly 10. However, this is not limited thereto.

The first joint adhesive 29 may use an optically clear adhesive (OCA), optical clear resin (OCR), or the like to have a high transmittance and reduce the influence on the display effect of the display region 19. However, this is not limited thereto.

Figure 16:
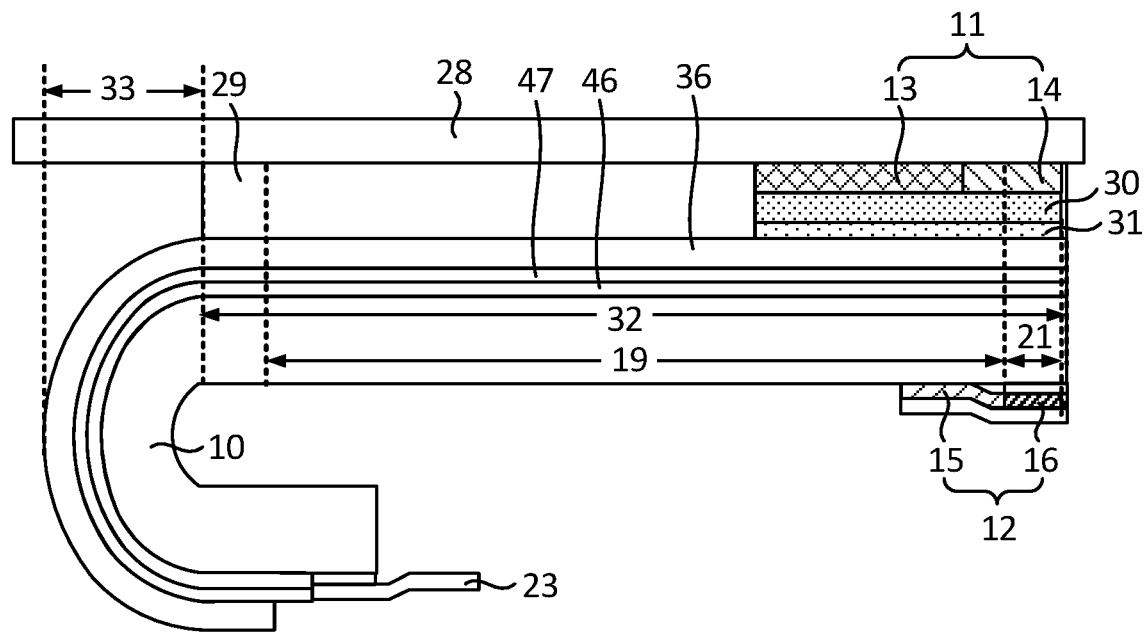
FIG. 16 is a cross-sectional view illustrating the structure of another display device according to the embodiments of the present disclosure.
Figure 17:
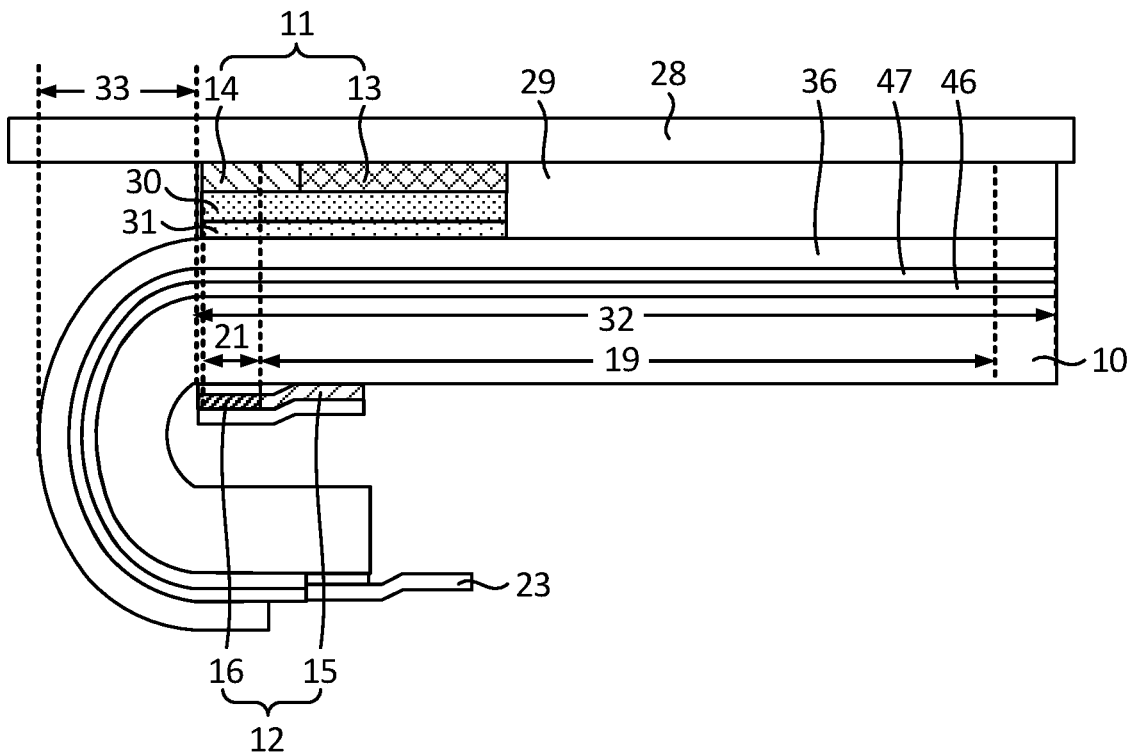
FIG. 17 is a cross-sectional view illustrating the structure of another display device according to the embodiments of the present disclosure.

FIG. 16 is a cross-sectional view illustrating the structure of another display device according to the embodiments of the present disclosure. FIG. 17 is a cross-sectional view illustrating the structure of another display device according to the embodiments of the present disclosure. As shown in FIG. 16 and FIG. 17, optionally, the display device provided in the embodiments of the present disclosure also includes a transparent support film 30. The transparent support film 30 is disposed on the side of an antenna 11 facing a protection structure 28. Alternatively, the transparent support film 30 is disposed on the side of the antenna 11 facing away from the protection structure 28. The antenna 11 is in contact with and connected to the transparent support film 30.

Specifically, as shown in FIG. 16 and FIG. 17, when the antenna 11 is configured, the antenna 11 may be prepared on the transparent support film 30 so that the transparent support film 30 supports the antenna 11. After the antenna 11 is disposed on the transparent support film 30, the transparent support film 30 on which the antenna 11 is prepared is adhered to the display assembly 10.

According to the preceding technical solutions, the setting range of the antenna 11 is not limited by the range of the protection structure 28. That is, the antenna 11 can be set outside the coverage range of the protection structure 28. The design is more free and flexible.

The transparent support film 30 may use polyimide (PI) to meet the light-transmissive and support requirements. However, this is not limited thereto. Those skilled in the art may set according to actual requirements.

Still referring to FIG. 16 and FIG. 17, the transparent support film 30 on which the antenna 11 is prepared can be adhered to the display assembly 10 by a second joint adhesive 31. Then, the protection structure 28 is adhered to the display assembly 10 by a first joint adhesive 29 to protect the antenna 11 on the display assembly 10. However, this is not limited thereto.

The first joint adhesive 29 and the second joint adhesive 31 may use an optically clear adhesive (OCA), optical clear resin (OCR), or the like to have a high transmittance and reduce the influence on the display effect of a display region 19. However, this is not limited thereto.

Still referring to FIG. 16 and FIG. 17, when the transparent support film 30 on which the antenna 11 is prepared is adhered to the display assembly 10, the transparent support film 30 may be disposed on one side of the antenna 11 facing away from the protection structure 28 to further protect the antenna 11. However, this is not limited thereto.

Figure 18:
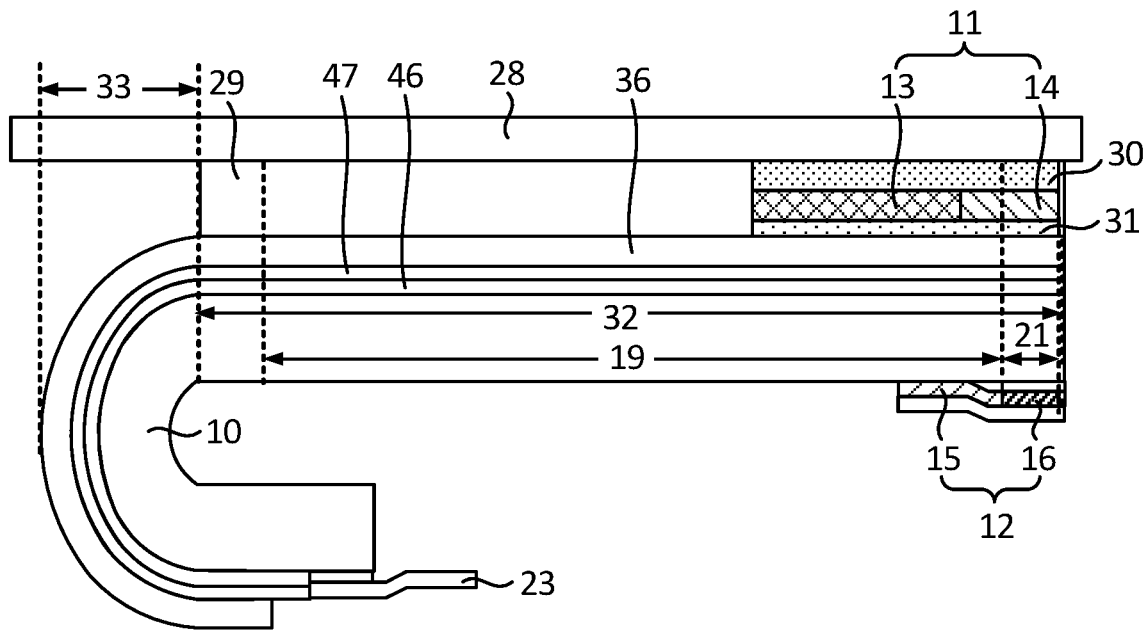
FIG. 18 is a cross-sectional view illustrating the structure of another display device according to the embodiments of the present disclosure.
Figure 19:
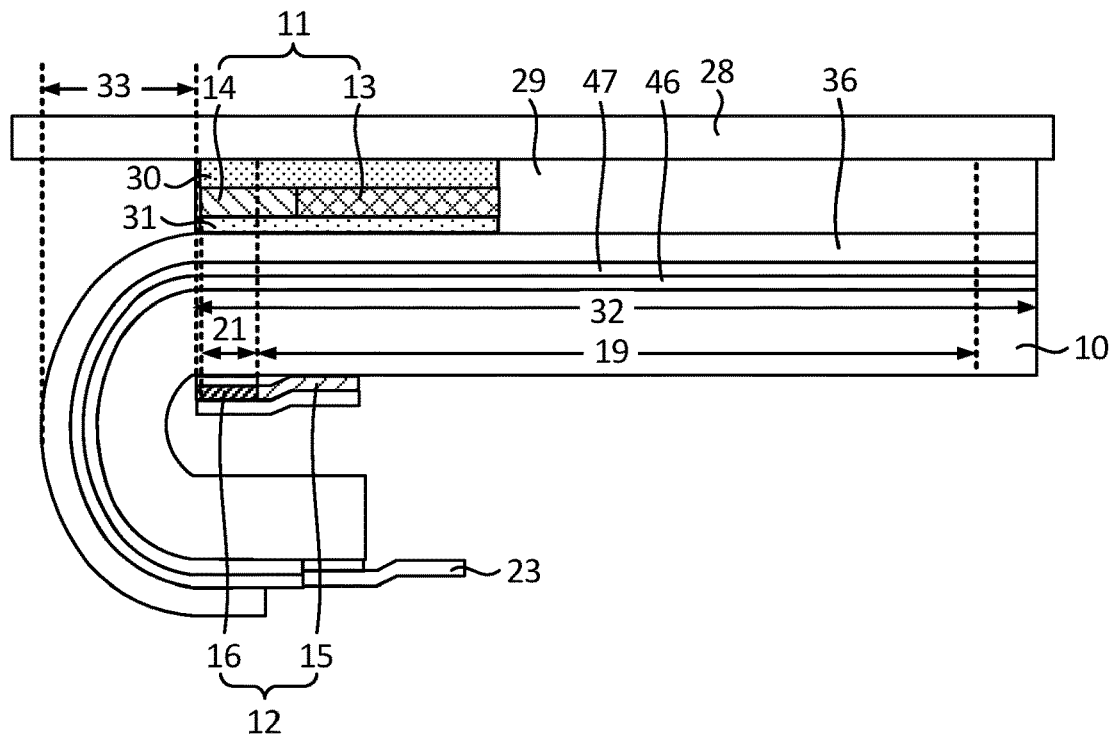
FIG. 19 is a cross-sectional view illustrating the structure of another display device according to the embodiments of the present disclosure.

FIG. 18 is a cross-sectional view illustrating the structure of another display device according to the embodiments of the present disclosure. FIG. 19 is a cross-sectional view illustrating the structure of another display device according to the embodiments of the present disclosure. As shown in FIG. 18 and FIG. 19, optionally, a transparent support film 30 may be disposed on one side of an antenna 11 facing a protection structure 28. This can reduce the influence of the transparent support film 30 on signal transceiving of the antenna 11 and help to improve the performance of the antenna 11. However, this is not limited thereto.

Figure 20:
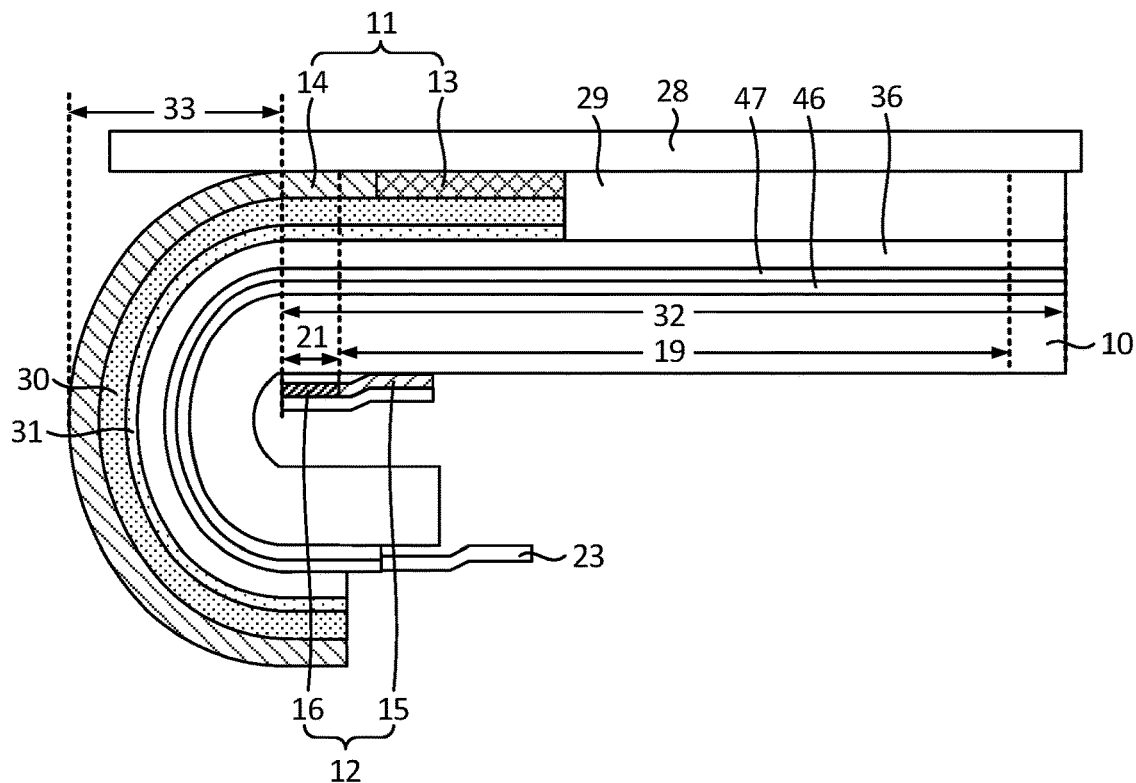
FIG. 20 is a cross-sectional view illustrating the structure of another display device according to the embodiments of the present disclosure.

FIG. 20 is a cross-sectional view illustrating the structure of another display device according to the embodiments of the present disclosure. As shown in FIG. 20, optionally, a display assembly 10 is a flexible display assembly. The flexible display assembly includes a non-bending region 32 and a bending region 33. At least part of an antenna 11 and at least part of a transparent support film 30 are disposed in the bending region 33.

Specifically, as shown in FIGS. 8, 10, and 16 to 20, the display assembly 10 is a flexible display assembly. The flexible display assembly is partially bent to form the non-bending region 32 and the bending region 33.

As shown in FIG. 20, at least part of the antenna 11 and at least part of the transparent support film 30 are disposed to bend with the flexible display assembly to extend to the side of the display device facing away from the light emission surface. In this manner, the setting area of the antenna 11 is ensured, and the bezel width of the display device is helped to reduce.

It is to be noted that FIG. 20 is only an example in which at least part of the first feed structure 14 of the antenna 11 is configured in the bending region 33. However, this is not limited thereto.

Figure 21:
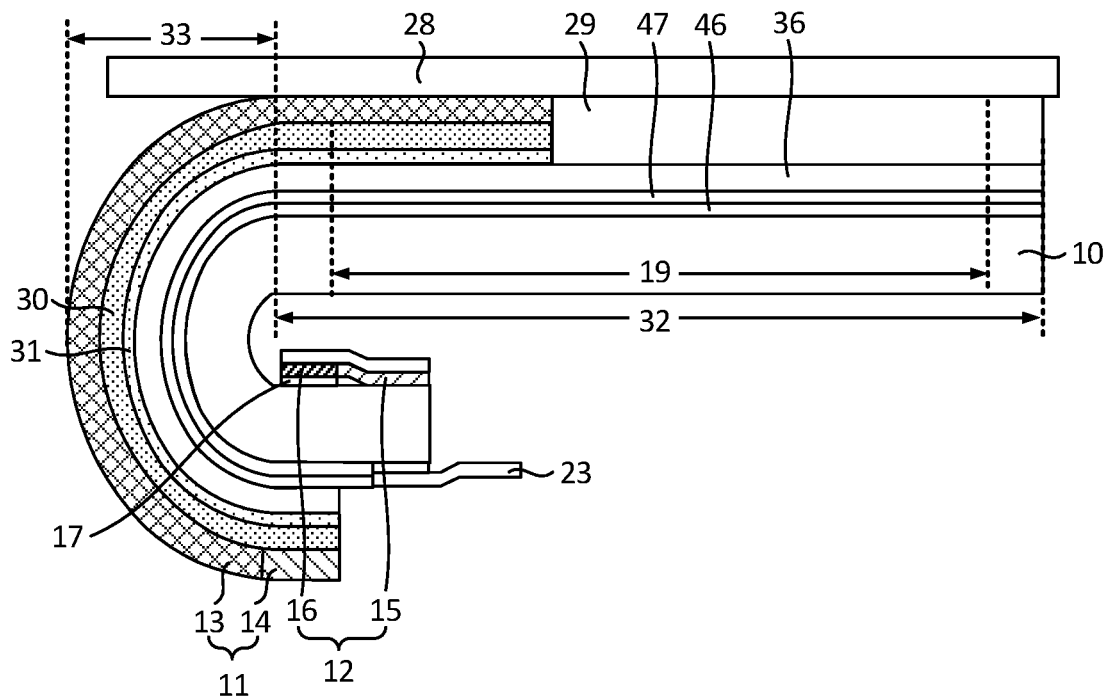
FIG. 21 is a cross-sectional view illustrating the structure of another display device according to the embodiments of the present disclosure.

FIG. 21 is a cross-sectional view illustrating the structure of another display device according to the embodiments of the present disclosure. As shown in FIG. 21, at least part of the radiator 13 of an antenna 11 may be disposed in a bending region 33. Thus, the side surface of the display device and the side of the display device facing away from the light emission surface can perform signal transceiving to increase the signal transceiving range. However, this is not limited thereto.

Still referring to FIG. 20, optionally, the overlapping region 21 of the first feed structure 14 and a second feed structure 16 is located in the non-bending region 32.

The overlapping region 21 of the first feed structure 14 and the second feed structure 16 is disposed in the non-bending region 32. Thus, the display assembly 10 between the antenna 11 and a feed circuit board 12 has good thickness uniformity, thereby ensuring the spacing uniformity between the antenna 11 and the feed circuit board 12, reducing the insertion loss between the antenna 11 and the feed circuit board 12, and solving the problem of large insertion loss.

Figure 22:
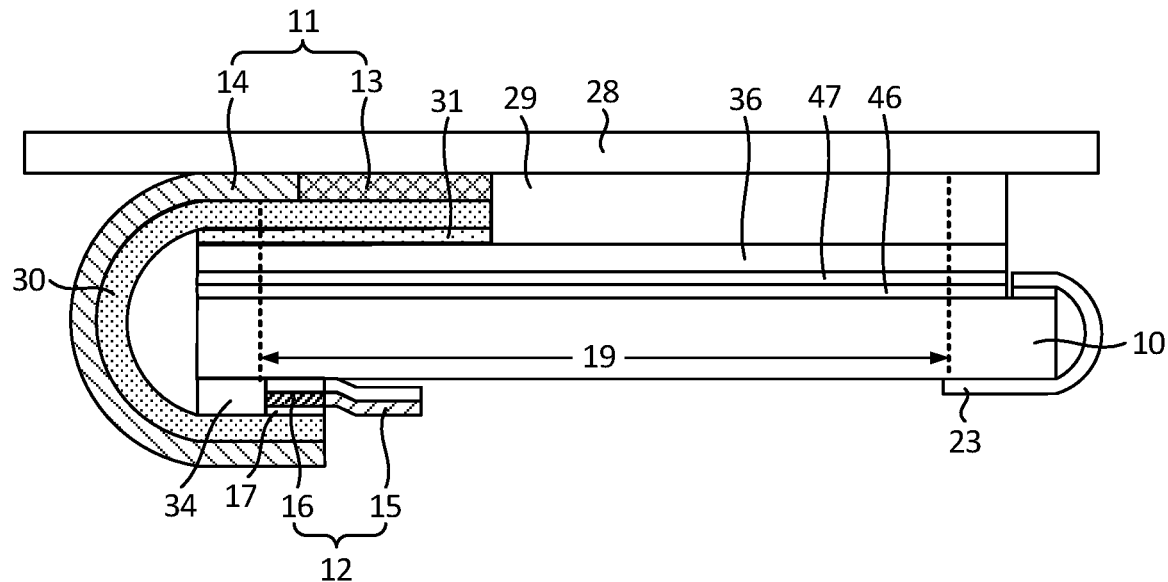
FIG. 22 is a cross-sectional view illustrating the structure of another display device according to the embodiments of the present disclosure.

FIG. 22 is a cross-sectional view illustrating the structure of another display device according to the embodiments of the present disclosure. As shown in FIG. 22, optionally, a display assembly 10 is a rigid display assembly. At least part of an antenna 11 and at least part of a transparent support film 30 are bent toward the side of the display assembly 10 facing away from the light emission surface.

Specifically, as shown in FIG. 22, for the rigid display assembly, the antenna 11 and the transparent support film 30 can be bent to the side of the display assembly 10 facing away from the light emission surface to help reduce the bezel width. At the same time, the side surface of the display assembly 10 and the side of the display assembly 10 facing away from the light emission surface can perform signal transceiving, thereby increasing the signal transceiving range.

Still referring to FIG. 21, optionally, the first feed structure 14 is disposed on the side of the display assembly 10 facing away from the light emission surface. The display device also includes an adhesive layer 17. The adhesive layer 17 is disposed on the side of the transparent support film 30 facing away from the antenna 11. The adhesive layer 17 is in contact with the feed circuit board 12 and the transparent support film 30 and the adhesive layer 17 is connected to the feed circuit board 12 and the transparent support film 30.

Specifically, as shown in FIG. 22, the feed circuit board 12 is fixed to the side of the transparent support film 30 facing away from the antenna 11 through the adhesive layer 17. The first feed structure 14 of the antenna 11 is coupled to the second feed structure 16 of the feed circuit board 12 through the transparent support film 30. Thus, the coupling distance between the antenna 11 and the feed circuit board 12 can be reduced, thereby reducing the coupling loss.

The adhesive layer 17 may be made of an insulation material without the use of an ACF adhesive, thereby ensuring the spacing uniformity between the antenna 11 and the feed circuit board 12, reducing the insertion loss between the antenna 11 and the feed circuit board 12, and helping to increase the gain of the antenna 11. At the same time, in the process of securing the feed circuit board 12, heating is not required, thereby reducing the risk of peeling off the metal on the feed circuit board 12.

Optionally, as shown in FIG. 22, the transparent support film 30 may be adhered to the surface of the side of the display assembly 10 facing away from the light emission surface by a third joint adhesive 34 to improve the reliability. However, this is not limited thereto.

The adhesive layer 17 and the third joint adhesive 34 may use an optically clear adhesive (OCA), optical clear resin (OCR), or the like. The adhesive process is simple and easy to implement. However, this is not limited thereto.

Figure 23:
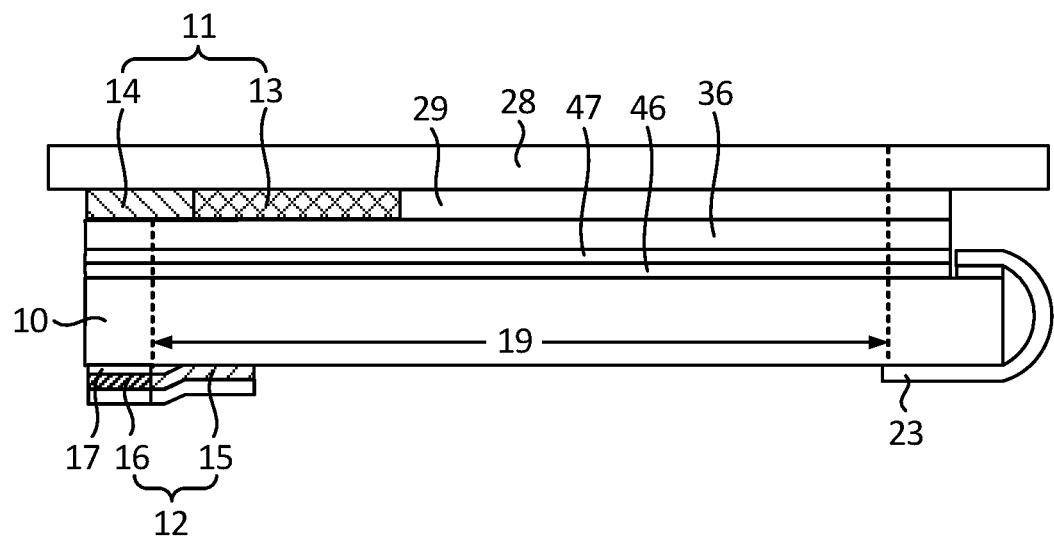
FIG. 23 is a cross-sectional view illustrating the structure of another display device according to the embodiments of the present disclosure.
Figure 24:
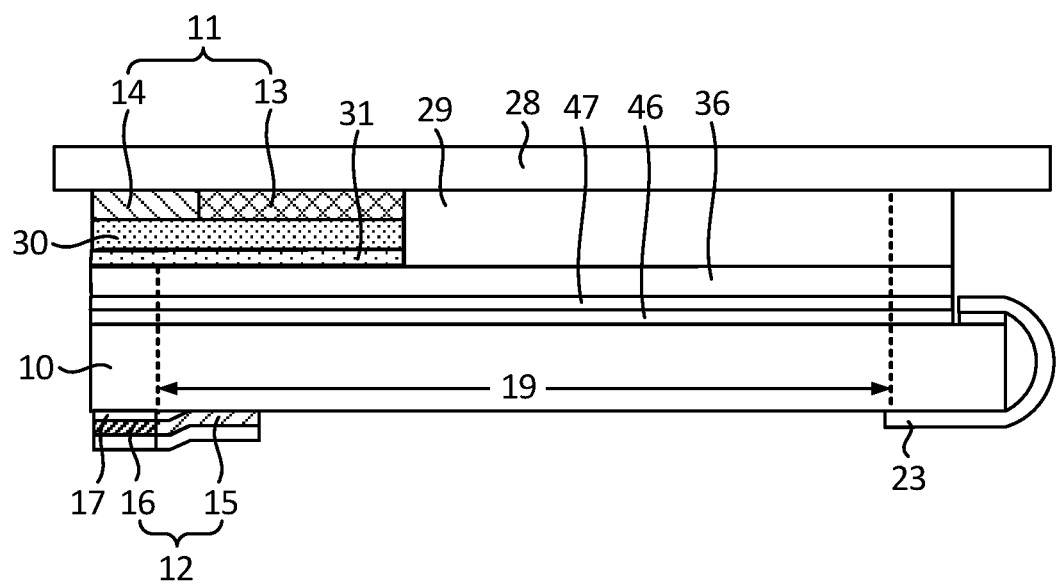
FIG. 24 is a cross-sectional view illustrating the structure of another display device according to the embodiments of the present disclosure.
Figure 25:
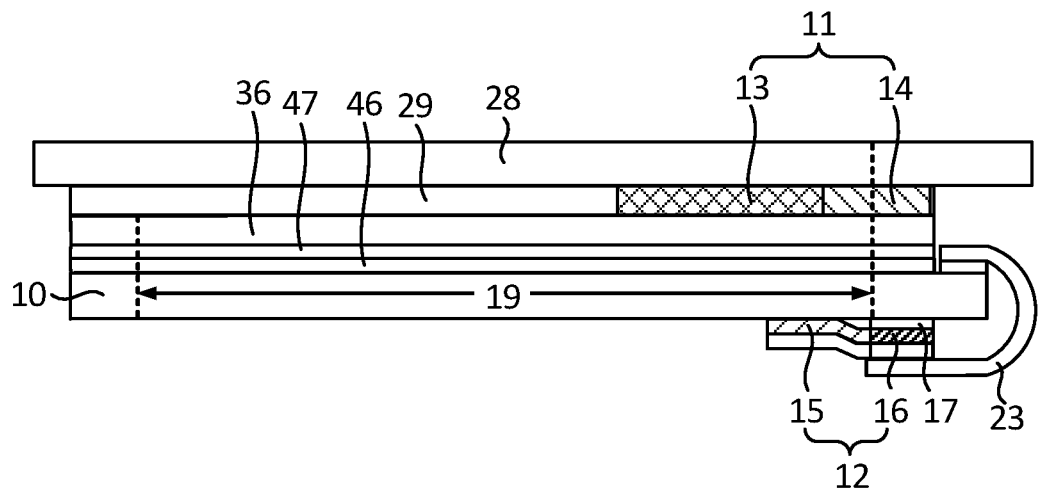
FIG. 25 is a cross-sectional view illustrating the structure of another display device according to the embodiments of the present disclosure.
Figure 26:
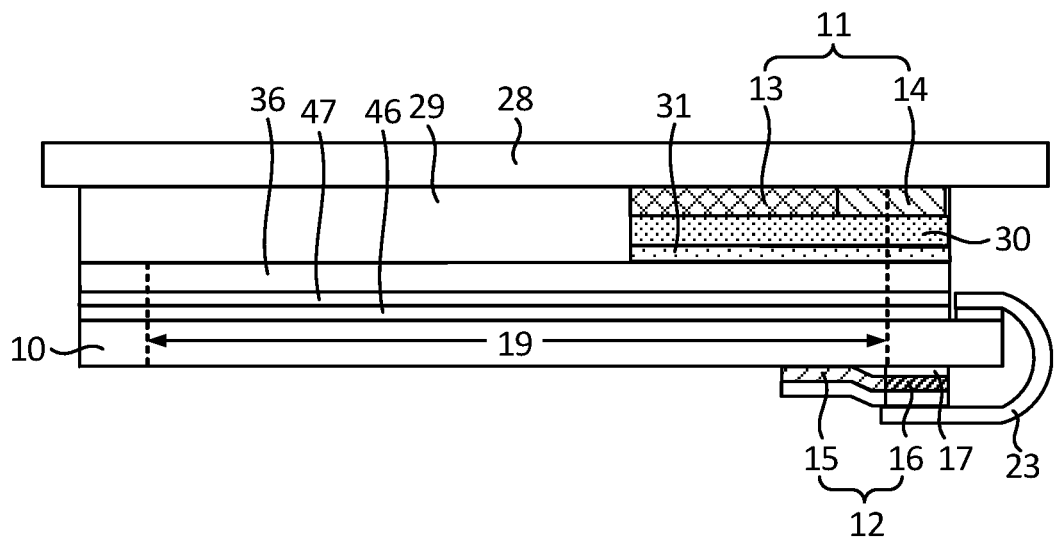
FIG. 26 is a cross-sectional view illustrating the structure of another display device according to the embodiments of the present disclosure.

FIG. 23 is a cross-sectional view illustrating the structure of another display device according to the embodiments of the present disclosure. FIG. 24 is a cross-sectional view illustrating the structure of another display device according to the embodiments of the present disclosure. FIG. 25 is a cross-sectional view illustrating the structure of another display device according to the embodiments of the present disclosure. FIG. 26 is a cross-sectional view illustrating the structure of another display device according to the embodiments of the present disclosure. As shown in FIGS. 23 to 26, the display assembly 10 is a rigid display assembly. The preceding technical solutions provided in any embodiment can also be applicable to the rigid display assembly. Therefore, the display device provided in the embodiments of the present disclosure has the technical effects in the technical solutions of any one of the preceding embodiments. The same or corresponding structure and the explanation of terms as those in the preceding embodiments are not repeated here.

Figure 27:
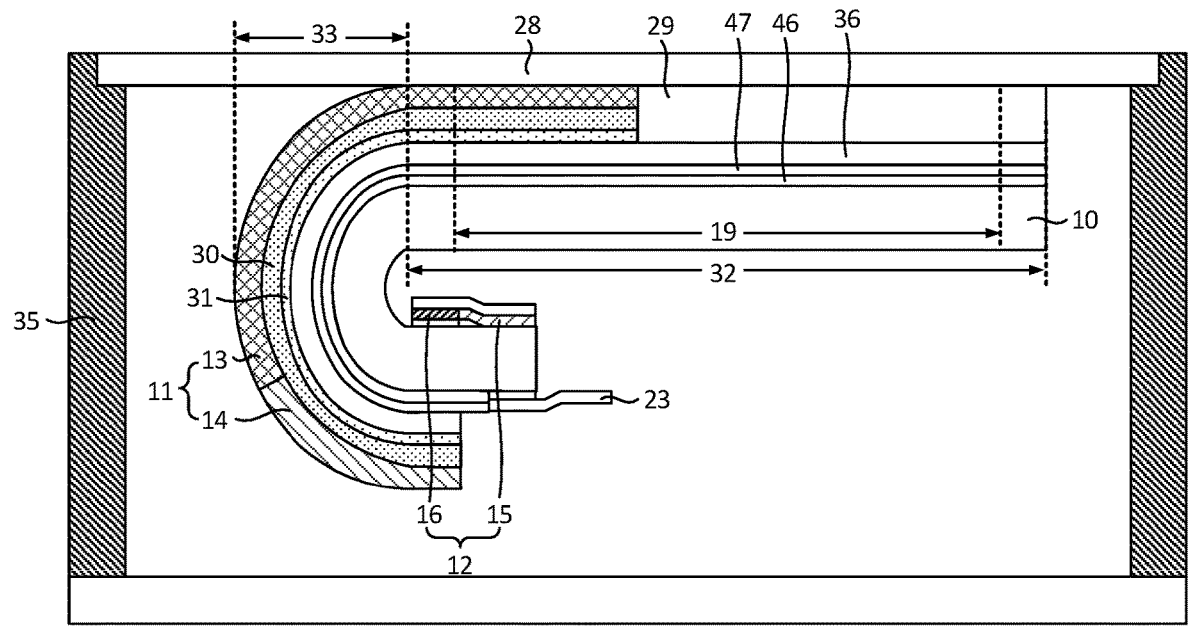
FIG. 27 is a cross-sectional view illustrating the structure of another display device according to the embodiments of the present disclosure.

FIG. 27 is a cross-sectional view illustrating the structure of another display device according to the embodiments of the present disclosure. As shown in FIG. 27, optionally, the display device provided in the embodiments of the present disclosure also includes side bezels 35. An antenna 11 includes a radiator 13. At least part of the radiator 13 is bent. The side bezels 35 are made of an insulation material.

Specifically, as shown in FIG. 27, the side surfaces of the display device are provided with side bezels 35 to support and protect components in the display device.

Still referring to FIG. 27, at least part of the radiator 13 of the antenna 11 is bent so that the side surfaces of the display device can perform signal transceiving to increase the signal transceiving range. However, this is not limited thereto.

Further, the material of the side bezels 35 is provided as an insulation material to prevent the side bezels 35 from forming signal shield against the radiator 13 of the antenna 11, thereby ensuring the use performance of the antenna 11.

It is to be noted that when the radiator 13 of the antenna 11 is not bent, that is, when the radiator 13 is located on only one side of the light emission surface of the display device, the material of the side bezels 35 may be a metal material to implement better support and protection action.

Still referring to FIGS. 8, 10, and 16 to 27, optionally, the display device provided in the embodiments of the present disclosure also includes a touch function layer 36. The touch function layer 36 is located on one side of the light emission surface of the display assembly 10. At least part of the antenna 11 is located on one side of the touch function layer 36 facing away from the display assembly 10. The antenna 11 at least partially overlaps the touch function layer 36 along the thickness direction of the display assembly 10.

Specifically, as shown in FIGS. 8, 10, and 16 to 27, the touch function layer 36 is disposed on one side of the light emission surface of the display assembly 10 to implement the touch function.

The touch function layer 36 may use an externally mounted touch panel (TP). The touch panel may be fixed to one side of the light emission surface of the display assembly 10 by a fourth joint adhesive 47. The antenna 11 at least partially overlaps the touch function layer 36 along the thickness direction of the display assembly 10. Thus, the setting area of the antenna 11 can be larger, thereby making the signal transceiving range of the antenna 11 larger and helping to improve the communication quality.

The fourth joint adhesive 47 may use an optically clear adhesive (OCA), optical clear resin (OCR), or the like to have a high transmittance and reduce the influence on the display effect of the display region 19. However, this is not limited thereto.

Figure 28:
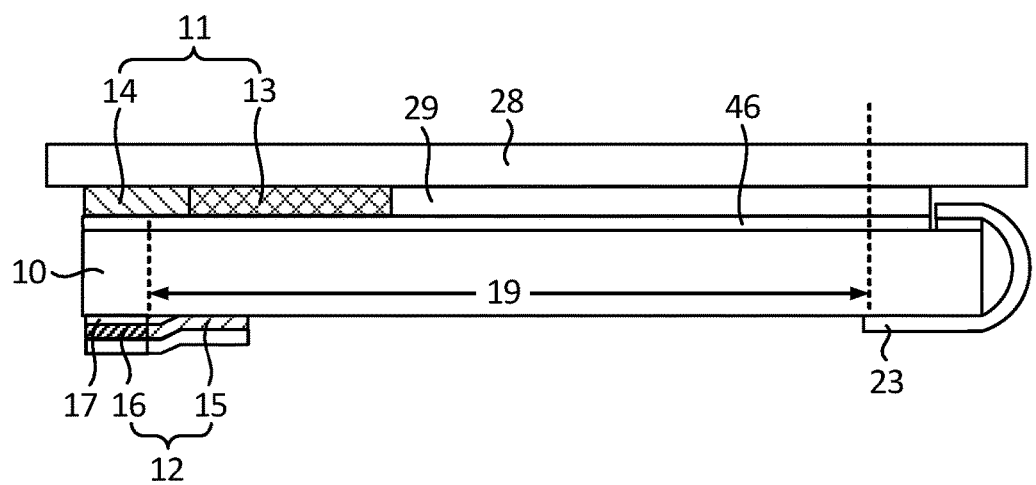
FIG. 28 is a cross-sectional view illustrating the structure of another display device according to the embodiments of the present disclosure.

FIG. 28 is a cross-sectional view illustrating the structure of another display device according to the embodiments of the present disclosure. As shown in FIG. 28, optionally, the display device provided in the embodiments of the present disclosure also includes a touch function layer (not shown). The touch function layer is located in a display assembly 10. An antenna 11 at least partially overlaps the touch function layer along the thickness direction of the display assembly 10.

Exemplarily, as shown in FIG. 28, the touch function layer is disposed in the display assembly 10 to implement the touch function.

The touch function layer is embedded in the display assembly 10 so that the thickness of the display device can be reduced, thereby helping to implement a light and thin design.

At the same time, the antenna 11 at least partially overlaps the touch function layer along the thickness direction of the display assembly 10. Thus, the setting area of the antenna 11 can be larger, thereby making the signal transceiving range of the antenna 11 larger and helping to improve the communication quality.

It is to be noted that the touch function layer may use self-capacitive touch or mutual capacitive touch. The self-capacitive touch means that touch electrodes arranged in horizontal and vertical arrays form self capacitance with a ground terminal or a human body to perform touch position detection. Mutual capacitance touch means that multiple touch emission electrodes and multiple touch sensing electrodes arranged in horizontal and vertical arrays are insulated and form mutual capacitance to perform touch position detection. Those skilled in the art may set according to actual requirements.

Figure 29:
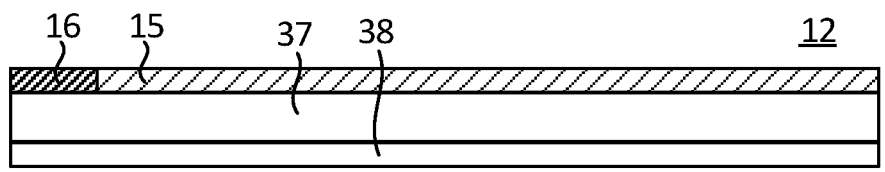
FIG. 29 is a cross-sectional view illustrating the structure of a feed circuit board according to the embodiments of the present disclosure.

FIG. 29 is a cross-sectional view illustrating the structure of a feed circuit board according to the embodiments of the present disclosure. As shown in FIG. 5 and FIG. 29, optionally, the feed circuit board 12 includes a support substrate 37 and a grounding metal layer 38. The power division network 15 and the second feed structure 16 are located on the same side of the support substrate 37. The grounding metal layer 38 is disposed on the side of the support substrate 37 facing away from the power division network 15. The grounding metal layer 38 at least partially overlaps the power division network 15 along the thickness direction of the support substrate 37.

Specifically, as shown in FIG. 5 and FIG. 29, the power division network 15 and the grounding metal layer 38 are disposed on two sides of the support substrate 37 in a one-to-one manner. The grounding metal layer 38 covers the power division network 15 along the thickness direction of the support substrate 37 so that the radio frequency signal is transmitted in the support substrate 37 between the power division network 15 and the grounding metal layer 38.

The material of the support substrate 37 may be a liquid crystal polymer (LCP). However, this is not limited thereto. In other embodiments, the feed circuit board 12 may use a flexible printed circuit (FPC). At the same time, the support substrate 37 may be polyimide or a polyester film. However, this is not limited thereto. Those skilled in the art may set according to actual requirements.

Optionally, the materials of the power division network 15 and the grounding metal layer 38 may be metal materials, such as silver alloy, copper, molybdenum, gold, silver, or aluminum. Thus, a smaller sheet resistance can be obtained, thereby reducing insertion loss and helping to increase the gain of the antenna 11.

Figure 30:
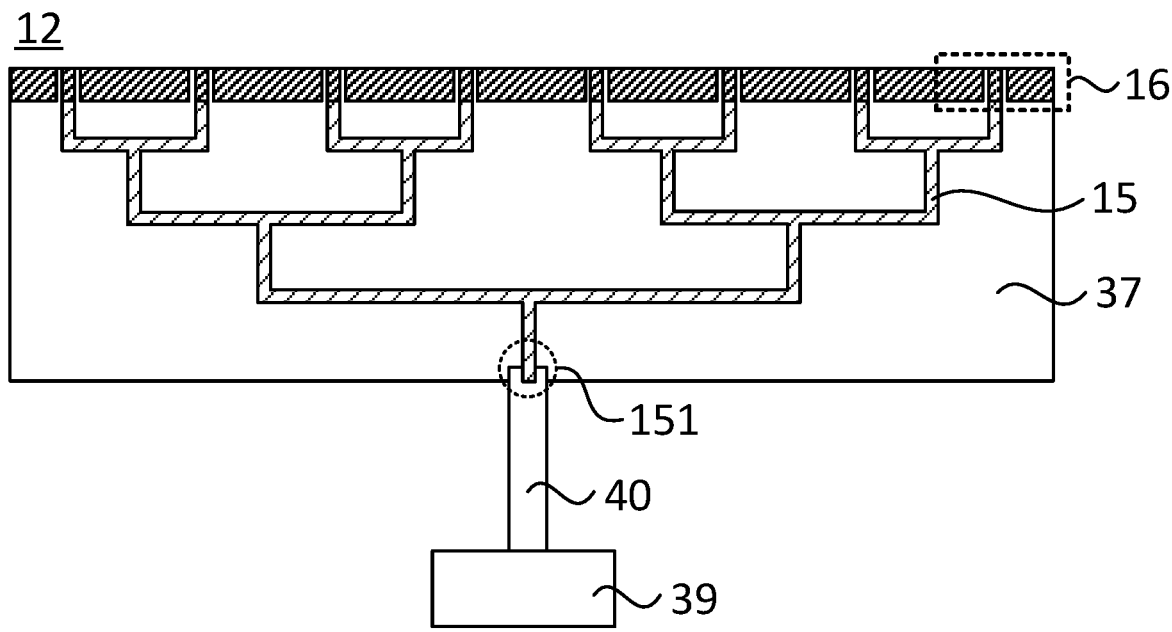
FIG. 30 is a diagram illustrating the connection structure of a feed circuit board according to the embodiments of the present disclosure.

FIG. 30 is a diagram illustrating the connection structure of a feed circuit board according to the embodiments of the present disclosure. As shown in FIG. 30, optionally, the display device provided in the embodiments of the present disclosure also includes a high frequency signal generator 39. A power division network 15 includes a high frequency signal lead-in terminal 151. The high frequency signal lead-in terminal 151 is electrically connected to the high frequency signal generator 39.

Specifically, as shown in FIG. 30, the high frequency signal generator 39 is used for generating a radio frequency signal having a certain frequency. The high frequency signal lead-in terminal 151 of the power division network 15 is used for receiving the radio frequency signal generated by the high frequency signal generator 39.

The high frequency signal lead-in terminal 151 of the power division network 15 may be electrically connected to the high frequency signal generator 39 by a coaxial cable 40. However, this is not limited thereto.

It is to be noted that the frequency of the radio frequency signal may be set according to actual requirements. The frequency range may be 1 GHz to 300 GHz, for example, 10 GHz. However, this is not limited thereto. Inventors have found through research that radio frequency signals whose frequencies are not lower than 1 GHz can be fed through coupling connection. Thus, the normal working of the antenna 11 in the embodiments can be ensured.

Figure 31:
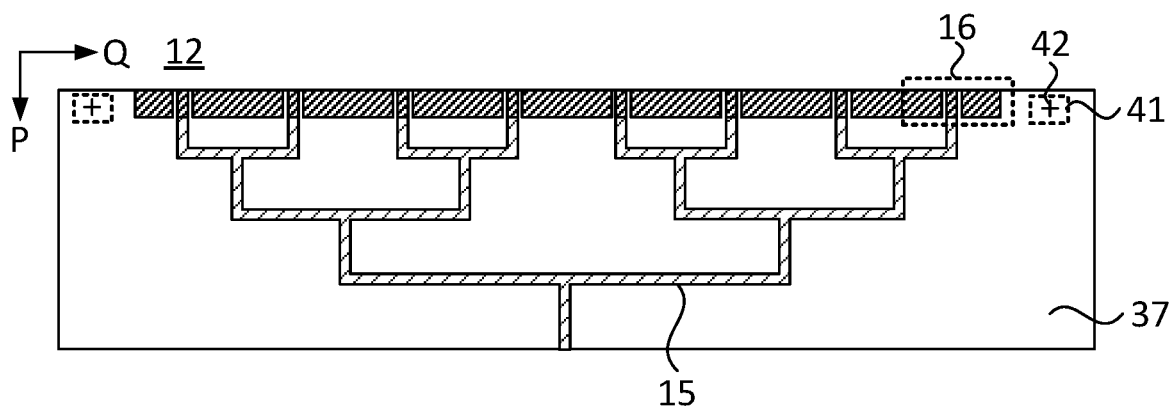
FIG. 31 is a diagram illustrating the structure of another feed circuit board according to the embodiments of the present disclosure.
Figure 32:
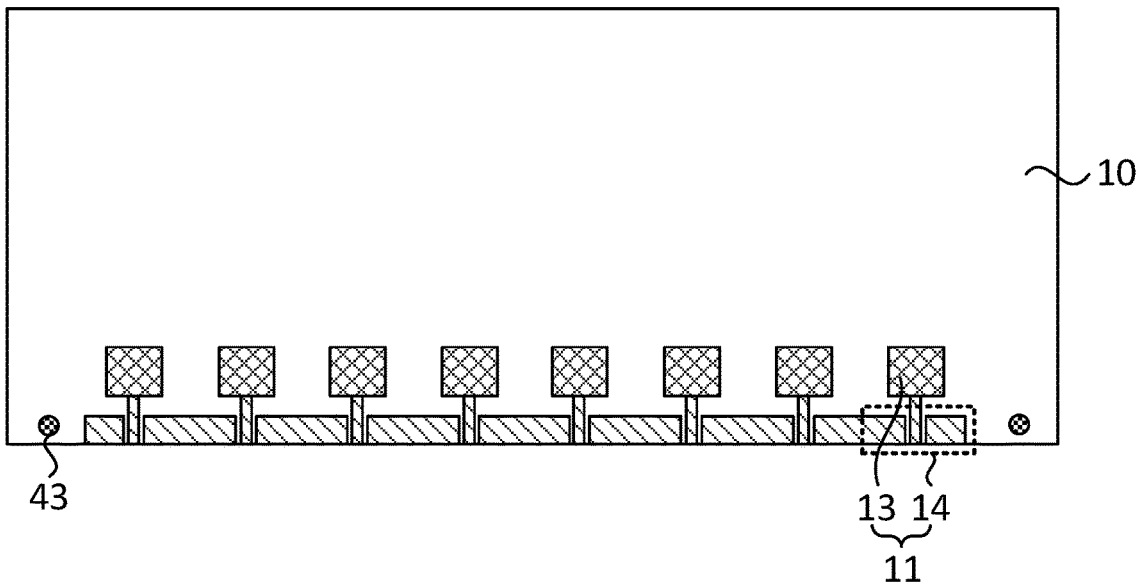
FIG. 32 is a diagram illustrating the structure of a display assembly according to the embodiments of the present disclosure.
Figure 33:
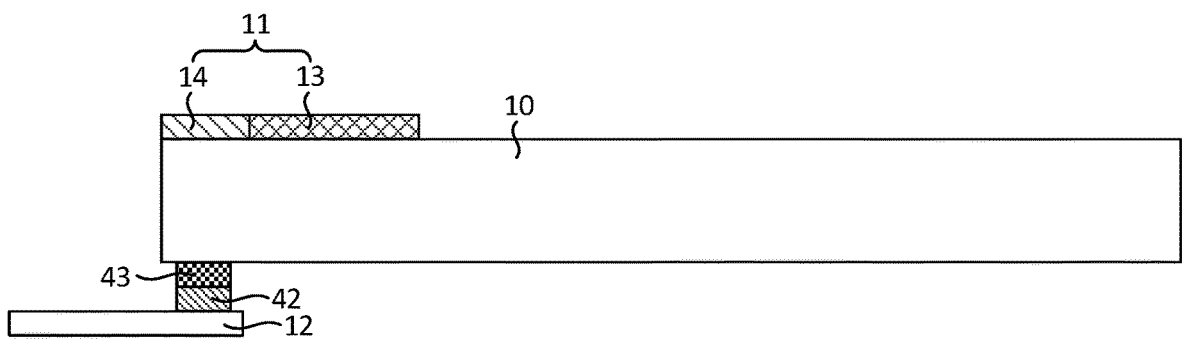
FIG. 33 is a diagram illustrating the alignment structure of a feed circuit board and a display assembly according to the embodiments of the present disclosure.
Figure 34:
FIG. 34 is a diagram illustrating another alignment structure of a feed circuit board and a display assembly according to the embodiments of the present disclosure.
Figure 35:
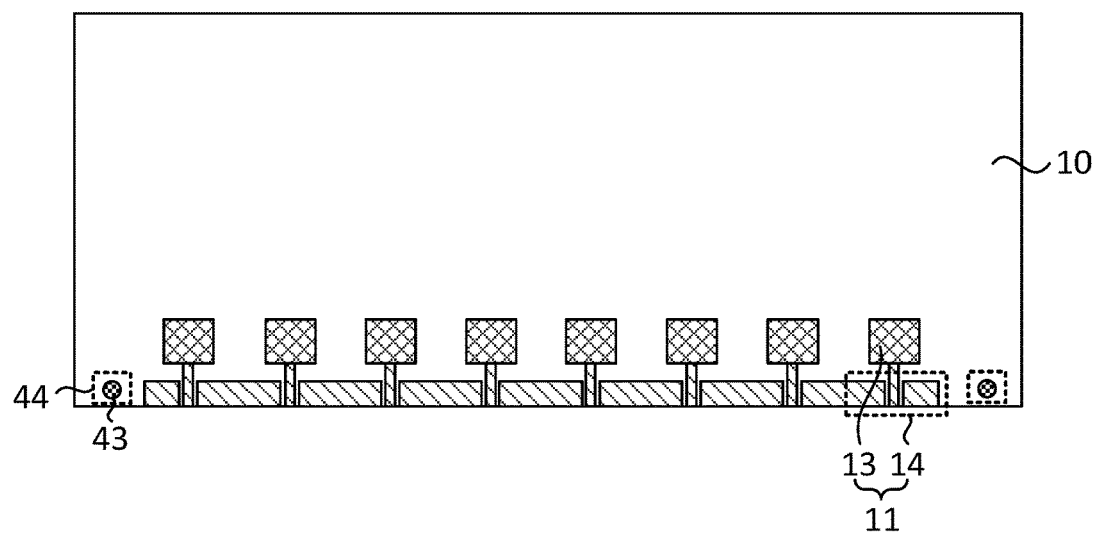
FIG. 35 is a diagram illustrating the structure of another display assembly according to the embodiments of the present disclosure.
Figure 36:
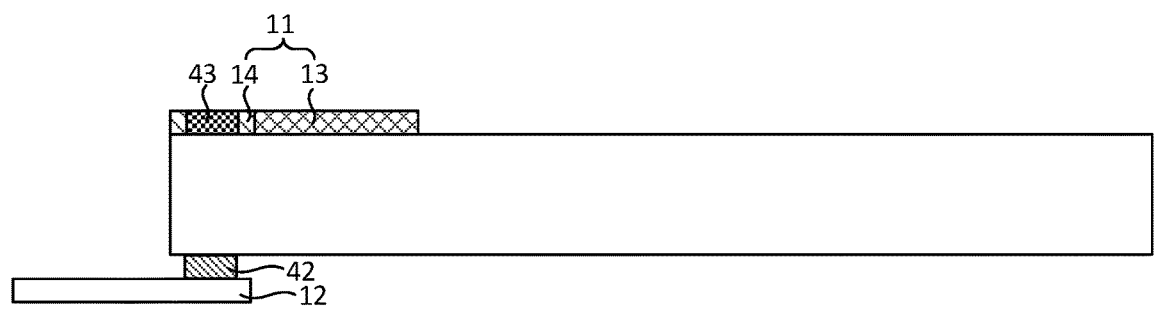
FIG. 36 is a diagram illustrating another alignment structure of a feed circuit board and a display assembly according to the embodiments of the present disclosure.

FIG. 31 is a diagram illustrating the structure of another feed circuit board according to the embodiments of the present disclosure. FIG. 32 is a diagram illustrating the structure of a display assembly according to the embodiments of the present disclosure. FIG. 33 is a diagram illustrating the alignment structure of a feed circuit board and a display assembly according to the embodiments of the present disclosure. FIG. 34 is a diagram illustrating another alignment structure of a feed circuit board and a display assembly according to the embodiments of the present disclosure. FIG. 35 is a diagram illustrating the structure of another display assembly according to the embodiments of the present disclosure. FIG. 36 is a diagram illustrating another alignment structure of a feed circuit board and a display assembly according to the embodiments of the present disclosure. As shown in FIGS. 31 to 36, optionally, a feed circuit board 12 includes first transparent regions 41. The first transparent regions 41 are provided with first alignment marks 42. A display assembly 10 is provided with second alignment marks 43. Along the thickness direction of the display assembly 10, the second alignment marks 43 overlap the first transparent regions 41, and the second alignment marks 43 are disposed corresponding to the first alignment marks 42. The second alignment marks 43 are located at the side of the display assembly 10 facing away from the light emission surface, and/or a display assembly 10 includes second transparent regions 44. Second alignment marks 43 are located in the second transparent regions 44.

Specifically, as shown in FIGS. 31 to 36, the first transparent regions 41 of the feed circuit board 12 are provided with the first alignment marks 42. The display assembly 10 is provided with the second alignment marks 43 corresponding to the first alignment marks 42. When the feed circuit board 12 is fixed to the side of the display assembly 10 facing away from the light emission surface, the positions of the second alignment marks 43 on the display assembly 10 can be seen through the first transparent regions 41 of the feed circuit board 12. The accurate positioning of the feed circuit board 12 on the display assembly 10 can be implemented by aligning the first alignment marks 42 with the second alignment marks 43.

As shown in FIG. 32 and FIG. 33, a first alignment mark 42 may be disposed at the side of the feed circuit board 12 facing the display assembly 10. When the feed circuit board 12 is fixed to the side of the display assembly 10 facing away from the light emission surface, the position of the first alignment mark 42 can be seen through a first transparent region 41 of the feed circuit board 12. However, this is not limited thereto.

As shown in FIG. 34, a first alignment mark 42 may be disposed at the side of the feed circuit board 12 facing away from the display assembly 10. When the feed circuit board 12 is fixed to the side of the display assembly 10 facing away from the light emission surface, the position of the first alignment mark 42 can be directly seen. Those skilled in the art may set according to actual requirements.

Still referring to FIGS. 32 to 34, optionally, a second alignment mark 43 may be disposed at the side of the display assembly 10 facing away from the light emission surface. Thus, when the feed circuit board 12 is fixed to the side of the display assembly 10 facing away from the light emission surface, the position of the second alignment mark 43 at the side of the display assembly 10 facing away from the light emission surface can be directly seen through a first transparent region 41 of the feed circuit board 12. The accurate positioning of the feed circuit board 12 on the display assembly 10 can be implemented by aligning the first alignment mark 42 with the second alignment mark 43.

In other embodiments, as shown in FIG. 35 and FIG. 36, a second transparent region 44 may be disposed on the display assembly 10. The second transparent region 44 is provided with a second alignment mark 43. At the same time, the second alignment mark 43 may be disposed not only at the side of the display assembly 10 facing away from the light emission surface, but also at the side of the light emission surface of the display assembly 10. When the feed circuit board 12 is fixed to the side of the display assembly 10 facing away from the light emission surface, the position of the second alignment mark 43 can be seen through the first transparent region 41 of the feed circuit board 12 and the second transparent region 44 on the display assembly 10. The accurate positioning of the feed circuit board 12 on the display assembly 10 can be implemented by aligning the first alignment mark 42 with the second alignment mark 43.

It is to be noted that the shape of the first alignment mark 42 and the shape of the second alignment mark 43 may be set arbitrarily according to actual requirements. The shape of the first alignment mark 42 and the shape of the second alignment mark 43 may be the same or different. For example, as shown in FIGS. 31 to 36, the first alignment mark 42 may be set to a cross shape, and the second alignment mark 43 may be set to a circular shape. The size of the first alignment mark 42 and the size of the second alignment mark 43 may be the same. When the first alignment mark 42 and the second alignment mark 43 are aligned, the cross shape may be set in the circular shape through relative movement between the feed circuit board 12 and the display assembly 10, thereby implementing accurate positioning of the feed circuit board 12 on the display assembly 10. However, this is not limited thereto.

In addition, the setting range of the first transparent region 41 may be set according to actual requirements, as long as the first transparent region 41 covers the first alignment mark 42. This is not specifically limited in the embodiments of the present disclosure.

At the same time, the setting range of the second transparent region 44 may be set according to actual requirements, as long as the second transparent region 44 covers the second alignment mark 43. This is not specifically limited in the embodiments of the present disclosure.

Figure 37:
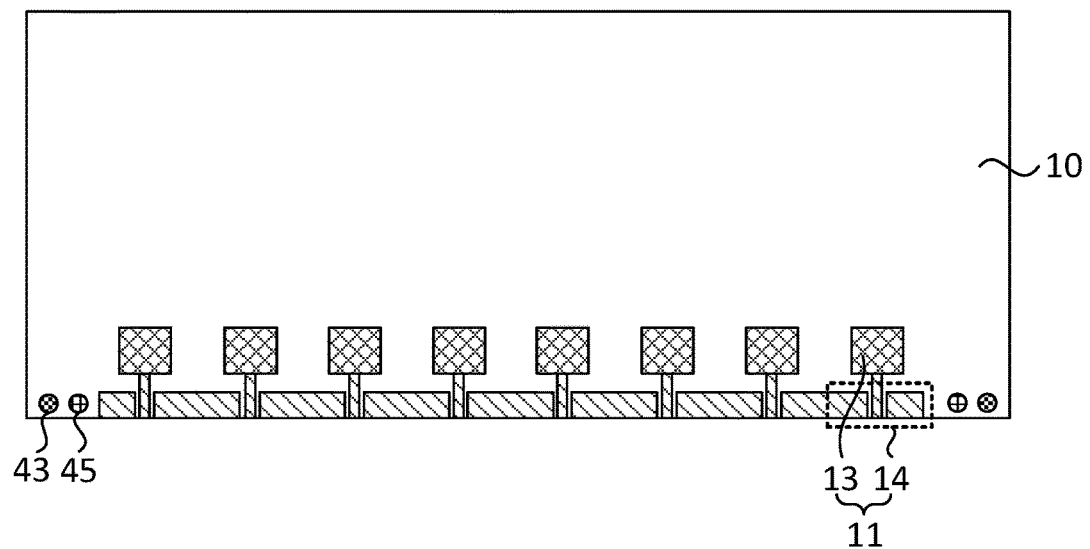
FIG. 37 is a diagram illustrating the structure of another display assembly according to the embodiments of the present disclosure.
Figure 38:
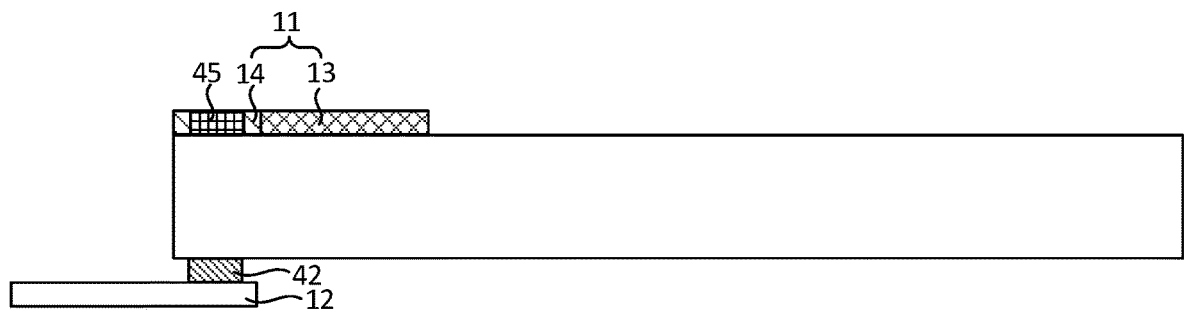
FIG. 38 is a diagram illustrating another alignment structure of a feed circuit board and a display assembly according to the embodiments of the present disclosure.
Figure 39:
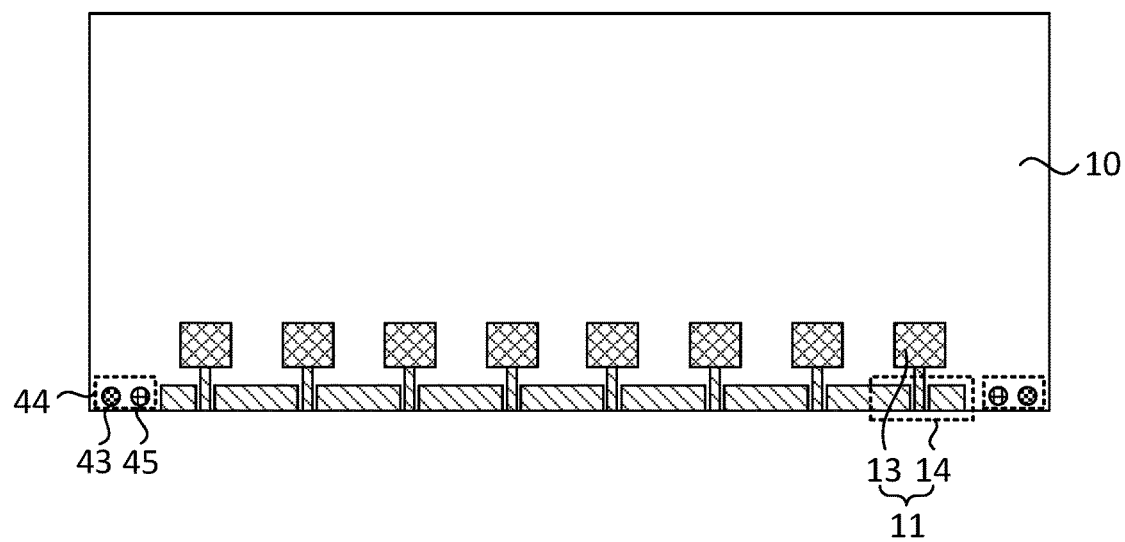
FIG. 39 is a diagram illustrating the structure of another display assembly according to the embodiments of the present disclosure.
Figure 40:
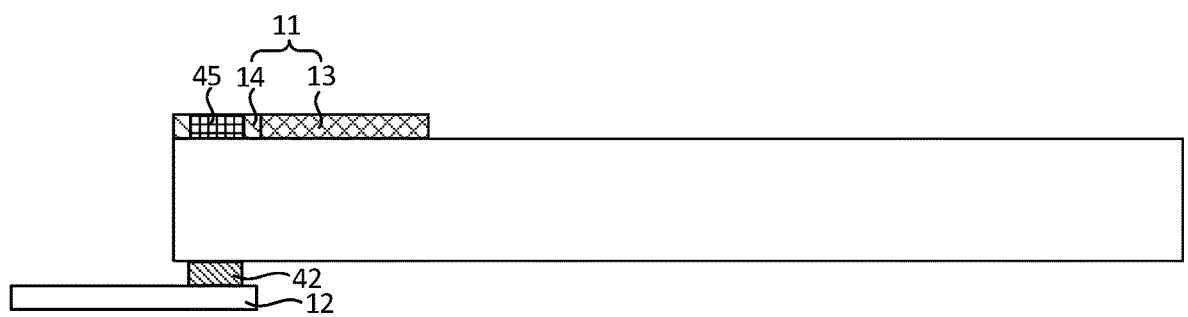
FIG. 40 is a diagram illustrating another alignment structure of a feed circuit board and a display assembly according to the embodiments of the present disclosure.

FIG. 37 is a diagram illustrating the structure of another display assembly according to the embodiments of the present disclosure. FIG. 38 is a diagram illustrating another alignment structure of a feed circuit board and a display assembly according to the embodiments of the present disclosure. FIG. 39 is a diagram illustrating the structure of another display assembly according to the embodiments of the present disclosure. FIG. 40 is a diagram illustrating another alignment structure of a feed circuit board and a display assembly according to the embodiments of the present disclosure. As shown in FIGS. 37 to 40, optionally, a display assembly 10 is provided with third alignment marks 45. The third alignment marks 45 are used for calibrating the setting position of an antenna 11. The third alignment marks 45 are located at the side of the light emission surface of the display assembly 10, and/or the third alignment marks 45 are located on second transparent regions 44.

Specifically, as shown in FIGS. 37 to 40, the display assembly 10 is provided with the third alignment marks 45. When the antenna 11 is disposed on the display assembly 10, the third alignment marks 45 are used for positioning the antenna 11. It is to be understood that the position of the antenna 11 relative to the display assembly 10 can be determined through the third alignment marks 45, and the position of a feed circuit board 12 relative to the display assembly 10 can be determined through first alignment marks 42 and second alignment marks 43. Thus, alignment between the antenna 11 and the feed circuit board 12 can be implemented, thereby ensuring the quality of the coupling connection between the antenna 11 and the feed circuit board 12.

Still referring to FIG. 37 and FIG. 38, optionally, the third alignment marks 45 may be disposed at the side of the light emission surface of the display assembly 10. Thus, when the antenna 11 is disposed at the side of the light emission surface of the display assembly 10, the third alignment marks 45 can be directly seen, thereby implementing accurate positioning of the antenna 11 on the display assembly 10.

Still referring to FIG. 39 and FIG. 40, optionally, a second transparent region 44 may be disposed on the display assembly 10. The second transparent region 44 is provided with a third alignment mark 45. At the same time, the third alignment mark 45 may be disposed not only at the side of the light emission surface of the display assembly 10, but also at the side of the display assembly 10 facing away from the light emission surface. Thus, when the antenna 11 is disposed at the side of the light emission surface of the display assembly 10, the position of the third alignment mark 45 can be seen through the second transparent region 44 on the display assembly 10, thereby implementing accurate positioning of the antenna 11 on the display assembly 10.

It is to be noted that the shape of the third alignment mark 45 may be set arbitrarily according to actual requirements. As shown in FIGS. 37 to 40, the third alignment mark 45 may be set to a circular shape. However, this is not limited thereto. In other embodiments, the third alignment mark 45 may be set to any shape such as a triangle, a rectangle, or a cross. Those skilled in the art may set according to actual requirements.

In addition, the setting range of the second transparent region 44 may be set according to actual requirements, as long as the second transparent region 44 covers the third alignment mark 45. This is not specifically limited in the embodiments of the present disclosure.

Figure 41:
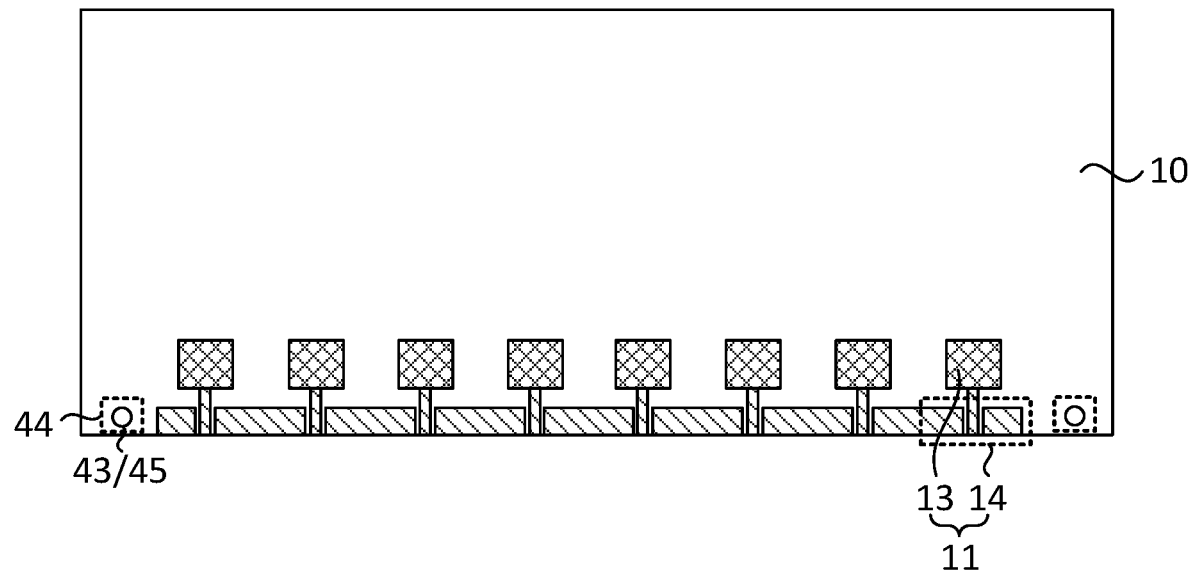
FIG. 41 is a diagram illustrating the structure of another display assembly according to the embodiments of the present disclosure.

FIG. 41 is a diagram illustrating the structure of another display assembly according to the embodiments of the present disclosure. As shown in FIG. 41, optionally, a second alignment mark 43 and a third alignment mark 45 are both located in a second transparent region 44. The second alignment mark 43 and the third alignment mark 45 are the same alignment mark.

Specifically, as shown in FIG. 41, the second transparent region 44 is disposed on a display assembly 10. In the second transparent region 44, the second alignment mark 43 and the third alignment mark 45 are the same alignment mark. At the same time, when a feed circuit board 12 is fixed to the side of the display assembly 10 facing away from the light emission surface, the position of the alignment mark can be seen. The accurate positioning of the feed circuit board 12 on the display assembly 10 can be implemented by aligning a first alignment mark 42 with the second alignment mark 43. When the antenna 11 is disposed at the side of the light emission surface of the display assembly 10, the position of the alignment mark can also be seen, thereby implementing accurate positioning of the antenna 11 on the display assembly 10.

With the preceding solutions, the setting area of the alignment mark can be reduced, thereby helping to reduce the bezel width of the display device.

It is to be understood that, in the embodiments, the second alignment mark 43 and the third alignment mark 45 are both located in the second transparent region 44. Therefore, the second alignment mark 43 and the third alignment mark 45 may be disposed at the side of the light emission surface of the display assembly 10 or the side of the display assembly 10 facing away from the light emission surface. Those skilled in the art may set according to actual requirements.

Still referring to FIG. 31, optionally, the power division network 15 and the second feed structures 16 are arranged along a third direction P. The first alignment marks 42 are located on two sides of the second feed structures 16 along a fourth direction Q. The third direction P intersects the fourth direction Q.

Exemplarily, as shown in FIG. 31, along the fourth direction Q, the first alignment marks 42 are disposed at two sides of the second feed structures 16 to help improve the alignment accuracy of the feed circuit board 12. However, this is not limited thereto. Those skilled in the art may set according to actual requirements.

Figure 42:
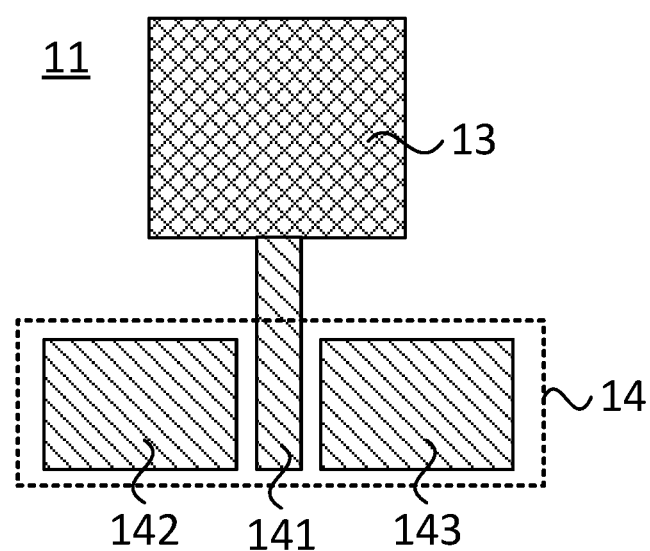
FIG. 42 is a diagram illustrating the structure of an antenna according to the embodiments of the present disclosure.

FIG. 42 is a diagram illustrating the structure of an antenna according to the embodiments of the present disclosure. As shown in FIG. 42, optionally, a first feed structure 14 of an antenna 11 includes a feed segment 141, a first grounding segment 142, and a second grounding segment 143. The feed segment 141 is disposed between the first grounding segment 142 and the second grounding segment 143. The feed segment 141 is connected to a radiator 13 and used for transmitting a radio frequency signal to the radiator 13. The feed segment 141, the first grounding segment 142, and the second grounding section 143 constitute a coplanar waveguide (CPW) structure. The coplanar waveguide structure has characteristics of a small volume, a light weight, and a plane structure so that the coplanar waveguide structure has advantages that are easy to obtain linear polarization, circular polarization, and dual polarization and advantages of multi-frequency band working. Moreover, as a microwave plane transmission structure having superior performance and convenient processing, the coplanar waveguide structure has performance advantages over a microstrip line in a millimeter wave frequency band.

Similarly, the second feed structures 16 of the feed circuit board 12 are disposed corresponding to the first feed structures 14 of the feed circuit board 12. This also constitutes a coplanar waveguide (CPW) structure to implement coupled feed between the second feed structures 16 and the first feed structures 14.

It is to be noted that the display device provided in the embodiments of the present disclosure is not limited to the preceding embodiments. Those skilled in the art may set other function components in the display device according to actual requirements.

For example, Still referring to FIGS. 8, 10, and 16 to 28, optionally, the display device also includes a polarizer 46. The polarizer 46 is located at the side of the light emission surface of the display assembly 10. The polarizer 46 is used for effectively resisting ambient light and reducing interference in display. However, this is not limited thereto.

It is to be noted that the display device provided in the embodiments of the present disclosure may be a mobile phone or may be any electronic product with display and wireless communication functions, including but not limited to the following categories: television, laptop, desktop display, tablet computer, digital camera, smart bracelet, smart glasses, vehicle-mounted display, medical device, industrial control device, touch interactive terminal, and wearable device. No special limitations are made thereto in the embodiments of the present disclosure.

Figure 43:
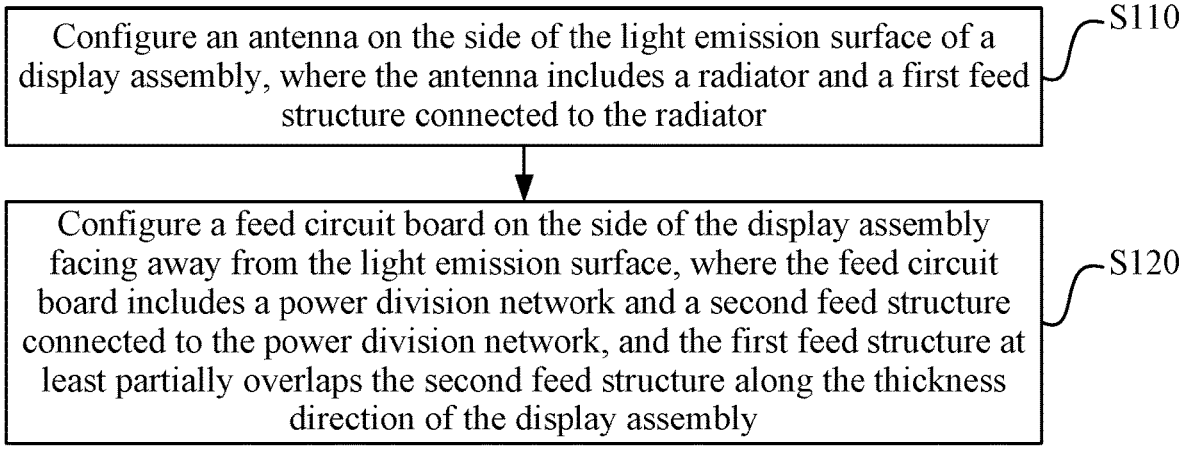
FIG. 43 is a flowchart illustrating a manufacturing method of a display device according to the embodiments of the present disclosure.

Based on the same inventive concept, the embodiments of the present disclosure also provide a manufacturing method of a display device which can be used for preparing any display device provided in the preceding embodiments. Explanations of structures and terms the same as or corresponding to structures and terms in the preceding embodiments are not repeated here. FIG. 43 is a flowchart illustrating a manufacturing method of a display device according to the embodiments of the present disclosure. As shown in FIG. 43, the method includes steps described below.

In S110, an antenna is configured on the side of the light emission surface of a display assembly. The antenna includes a radiator and a first feed structure connected to the radiator.

Specifically, the radiator is used for receiving the radio frequency signal transmitted from the first feed structure and radiating the radio frequency signal outwardly to implement the signal sending function of the antenna. At the same time, the radiator is also used for receiving the radio frequency signal transmitted from the outside and transmitting the radio frequency signal to the first feed structure to implement the signal receiving function of the antenna.

The antenna is configured on the side of the light emission surface of the display assembly so that signal interference can be reduced to improve the signal radiation performance of the antenna and solve the problem of poor signal radiation performance of the antenna.

It is to be noted that the antenna may be directly prepared on the side of the light emission surface of the display assembly. Alternatively, the antenna may be prepared separately, and then the antenna is adhered to the display assembly. However, this is not limited thereto. Those skilled in the art may set according to actual requirements.

In S120, a feed circuit board is configured on the side of the display assembly facing away from the light emission surface. The feed circuit board includes a power division network and a second feed structure connected to the power division network. The first feed structure at least partially overlaps the second feed structure along the thickness direction of the display assembly.

Specifically, the power division network is used for transmitting a radio frequency signal to each second feed structure. The power division network may be distributed in an arborescent shape and includes multiple branches. One branch provides a radio frequency signal for one second feed structure.

Further, the feed circuit board is disposed on the side of the display assembly facing away from the light emission surface. Thus, the space of the bezel region on the side of the light emission surface of the display assembly is not occupied, thereby facilitating the implementation of a narrow bezel and solving the problem of a wider bezel.

At the same time, the antenna and the feed circuit board are located on different sides of the display assembly. The first feed structure at least partially overlaps the second feed structure along the thickness direction of the display assembly so that the coupling connection between the antenna and the feed circuit board is implemented. Thus, coupled feed between the antenna and the feed circuit board is implemented, and transmission of the radio frequency signal between the antenna and the feed circuit board is ensured.

With the preceding technical solutions, the following technical effects can be implemented.

1. The antenna and the feed circuit board are coupled. The antenna and the feed circuit board are not in contact with each other, that is, a direct electrical connection is not required between the antenna and the feed circuit board. Therefore, the electrical connection is not required to be implemented through the ACF adhesive bonding so that there is no problem that the particle size of the conductive particles in the ACF adhesive is uneven after being pressed. Moreover, the antenna and the feed circuit board are located on different sides of the display assembly. The display assembly between the antenna and the feed circuit board has good thickness uniformity, thereby further ensuring the spacing uniformity between the antenna and the feed circuit board, reducing the insertion loss between the antenna and the feed circuit board, and solving the problem of large insertion loss.

2. Since the preceding solutions do not need to implement the electrical connection through the ACF adhesive bonding, when the antenna and the feed circuit board are coupled, heating is not required. Thus, the risk of peeling off the antenna from the carrier film layer thereof is reduced, and the problem that the antenna is easy to be peeled off in the existing heating process is solved.

Figure 44:
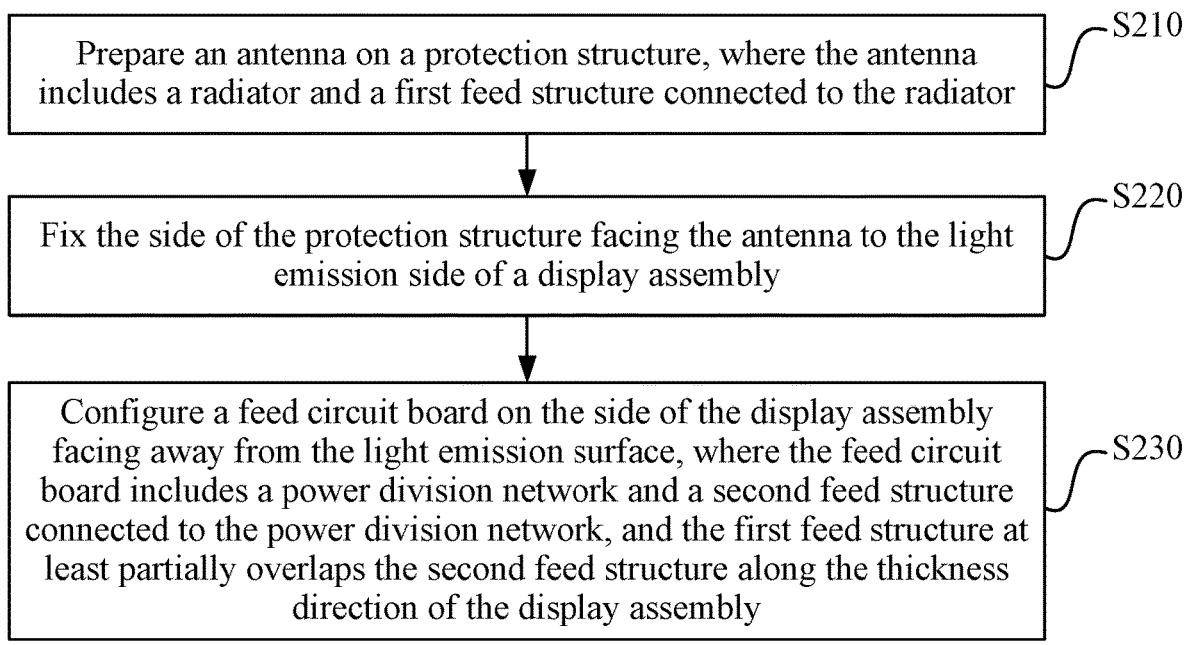
FIG. 44 is a flowchart illustrating another manufacturing method of a display device according to the embodiments of the present disclosure.

Based on the same inventive concept, the embodiments of the present disclosure also provide a manufacturing method of a display device which can be used for preparing the display device provided in the preceding embodiments. Explanations of structures and terms the same as or corresponding to structures and terms in the preceding embodiments are not repeated here. FIG. 44 is a flowchart illustrating another manufacturing method of a display device according to the embodiments of the present disclosure. As shown in FIG. 44, the method includes steps described below.

In S210, an antenna is configured on a protection structure. The antenna includes a radiator and a first feed structure connected to the radiator.

Specifically, the protection structure may use a transparent hard substrate. Thus, the antenna can be disposed on the protection structure through a physical vapor deposition (PVD) process or a PVD+plating process to form a protection structure with the antenna.

The density of the antenna prepared by the PVD process is better. Thus, the resistance of the antenna is smaller, and the loss is smaller, thereby helping to improve the antenna performance.

It is to be noted that the thickness of a conventional antenna ranges from 1 µm to 3 µm. Therefore, only the PVD process can meet the thickness requirement of the antenna.

Further, the thicker the antenna, the smaller the loss. Therefore, a thicker metal film layer can be prepared through increasing the plating process so that a thicker antenna can be prepared. Therefore, using the PVD+plating process helps to reduce the loss and improve the antenna performance.

In S220, the side of the protection structure facing the antenna is fixed to the light emission side of a display assembly.

Specifically, after the antenna is disposed on the protection structure, the protection structure on which the antenna is prepared can be adhered to the display assembly by a first joint adhesive. However, this is not limited thereto.

The protection structure can cover the antenna and the display assembly to protect the antenna and the display assembly.

At the same time, the antenna is disposed on the side of the light emission surface of the display assembly so that signal interference can be reduced to improve the signal radiation performance of the antenna and solve the problem of poor signal radiation performance of the antenna.

The protection structure may be a glass cover plate to implement a high transmittance and a high hardness. Thus, the antenna and the display assembly can be protected without affecting the display. However, this is not limited thereto.

The first joint adhesive may use an optically clear adhesive (OCA), optical clear resin (OCR), or the like to have a high transmittance and reduce the influence on the display effect of a display region. However, this is not limited thereto.

In S230, a feed circuit board is disposed on the side of the display assembly facing away from the light emission surface. The feed circuit board includes a power division network and a second feed structure connected to the power division network. The first feed structure at least partially overlaps the second feed structure along the thickness direction of the display assembly.

The feed circuit board is disposed on the side of the display assembly facing away from the light emission surface. Thus, the space of the bezel region on the side of the light emission surface of the display assembly is not occupied, thereby facilitating the implementation of a narrow bezel and solving the problem of a wider bezel.

At the same time, the antenna and the feed circuit board are located on different sides of the display assembly. The first feed structure at least partially overlaps the second feed structure along the thickness direction of the display assembly so that the coupling connection between the antenna and the feed circuit board is implemented. Thus, coupled feed between the antenna and the feed circuit board is implemented, and transmission of the radio frequency signal between the antenna and the feed circuit board is ensured.

With the preceding technical solutions, the following technical effects can be implemented.

1. The antenna and the feed circuit board are coupled. The antenna and the feed circuit board are not in contact with each other, that is, a direct electrical connection is not required between the antenna and the feed circuit board. Therefore, the electrical connection is not required to be implemented through the ACF adhesive bonding so that there is no problem that the particle size of the conductive particles in the ACF adhesive is uneven after being pressed. Moreover, the antenna and the feed circuit board are located on different sides of the display assembly. The display assembly between the antenna and the feed circuit board has good thickness uniformity, thereby further ensuring the spacing uniformity between the antenna and the feed circuit board, reducing the insertion loss between the antenna and the feed circuit board, and solving the problem of large insertion loss.

2. Since the preceding solutions do not need to implement the electrical connection through the ACF adhesive bonding, when the antenna and the feed circuit board are coupled, heating is not required. Thus, the risk of peeling off the antenna from the carrier film layer thereof is reduced, and the problem that the antenna is easy to be peeled off in the existing heating process is solved.

Figure 45:
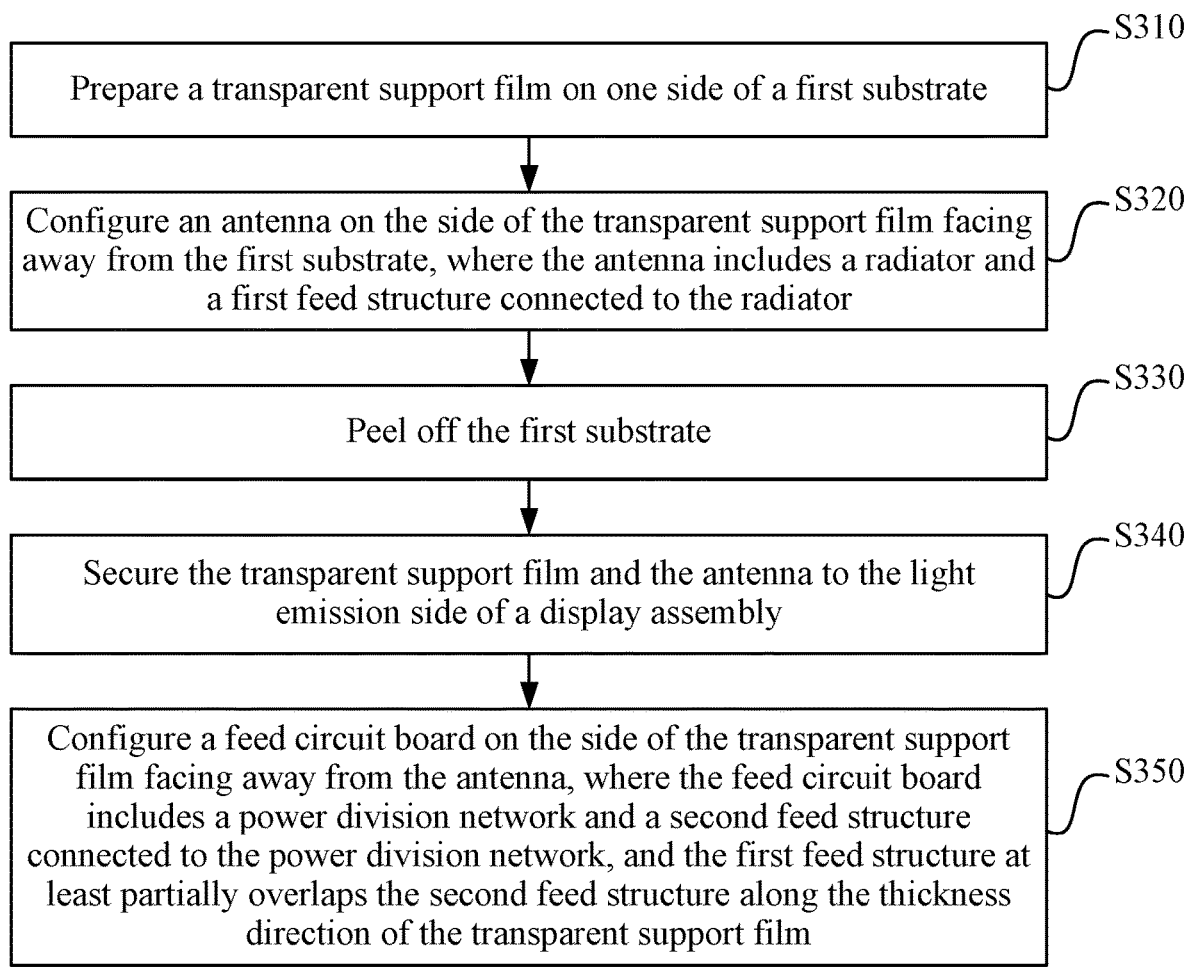
FIG. 45 is a flowchart illustrating another manufacturing method of a display device according to the embodiments of the present disclosure.

Based on the same inventive concept, the embodiments of the present disclosure also provide a manufacturing method of a display device which can be used for preparing any display device provided in the preceding embodiments. Explanations of structures and terms the same as or corresponding to structures and terms in the preceding embodiments are not repeated here. FIG. 45 is a flowchart illustrating another manufacturing method of a display device according to the embodiments of the present disclosure. As shown in FIG. 45, the method includes steps described below.

In S310, a transparent support film is prepared on one side of a first substrate.

The first substrate may be a hard substrate such as glass. Those skilled in the art may set according to actual requirements.

The transparent support film may use polyimide (PI) to meet the light-transmissive and support requirements. However, this is not limited thereto. Those skilled in the art may set according to actual requirements.

In S320, an antenna is configured on the side of the transparent support film facing away from the first substrate. The antenna includes a radiator and a first feed structure connected to the radiator.

Specifically, the antenna is prepared on the transparent support film through the physical vapor deposition (PVD) process or the PVD+plating process.

The density of the antenna prepared by the PVD process is better. Thus, the resistance of the antenna is smaller, and the loss is smaller, thereby helping to improve the antenna performance.

It is to be noted that the thickness of a conventional antenna ranges from 1 μm to 3 μm. Therefore, only the PVD process can meet the thickness requirement of the antenna.

Further, the thicker the antenna, the smaller the loss. Therefore, a thicker metal film layer can be prepared through increasing the plating process so that a thicker antenna can be prepared.

Therefore, using the PVD+plating process helps to reduce the loss and improve the antenna performance.

In S330, the first substrate is peeled off.

The first substrate is peeled off to obtain a transparent support film prepared with an antenna. The transparent support film can support the antenna.

In S340, the transparent support film and the antenna are fixed to the light emission side of a display assembly.

The transparent support film on which the antenna is prepared may be adhered to the light emission side of the display assembly by a second joint adhesive. The second joint adhesive may use an optically clear adhesive (OCA), optical clear resin (OCR), or the like to have a high transmittance, thereby reducing the influence on the display effect of a display region. However, this is not limited thereto.

At the same time, the antenna is disposed on the side of the light emission surface of the display assembly so that signal interference can be reduced to improve the signal radiation performance of the antenna and solve the problem of poor signal radiation performance of the antenna.

In S350, a feed circuit board is disposed on the side of the transparent support film facing away from the antenna. The feed circuit board includes a power division network and a second feed structure connected to the power division network. The first feed structure at least partially overlaps the second feed structure along the thickness direction of the transparent support film.

The feed circuit board is disposed on the side of the display assembly facing away from the light emission surface. Thus, the space of the bezel region on the side of the light emission surface of the display assembly is not occupied, thereby facilitating the implementation of a narrow bezel and solving the problem of a wider bezel.

At the same time, the antenna and the feed circuit board are located on different sides of the display assembly. The first feed structure at least partially overlaps the second feed structure along the thickness direction of the display assembly so that the coupling connection between the antenna and the feed circuit board is implemented. Thus, coupled feed between the antenna and the feed circuit board is implemented, and transmission of the radio frequency signal between the antenna and the feed circuit board is ensured.

With the preceding technical solutions, the following technical effects can be implemented.

1. The antenna and the feed circuit board are coupled. The antenna and the feed circuit board are not in contact with each other, that is, a direct electrical connection is not required between the antenna and the feed circuit board. Therefore, the electrical connection is not required to be implemented through the ACF adhesive bonding so that there is no problem that the particle size of the conductive particles in the ACF adhesive is uneven after being pressed. Moreover, the antenna and the feed circuit board are located on different sides of the display assembly. The display assembly between the antenna and the feed circuit board has good thickness uniformity, thereby further ensuring the spacing uniformity between the antenna and the feed circuit board, reducing the insertion loss between the antenna and the feed circuit board, and solving the problem of large insertion loss.

2. Since the preceding solutions do not need to implement the electrical connection through the ACF adhesive for bonding, when the antenna and the feed circuit board are coupled, heating is not required. Thus, the risk of peeling off the antenna from the carrier film layer thereof is reduced, and the problem that the antenna is easy to be peeled off in the existing heating process is solved.

It is to be understood that various forms of processes shown above may be adopted with steps reordered, added or deleted. For example, the steps described in the present disclosure may be performed in parallel, sequentially or in different orders, as long as the desired results of the technical solutions of the present disclosure can be implemented, and no limitation is imposed herein.

The preceding embodiments do not constitute a limitation on the protection scope of the present disclosure. It is to be understood by those skilled in the art that various modifications, combinations, sub-combinations, and substitutions may be performed according to design requirements and other factors. Any modifications, equivalent replacements, improvements and the like within the spirit and principle of the present disclosure shall fall within the protection scope of the present disclosure.

What is claimed is:

1. A display device, comprising a display assembly, an antenna, and a feed circuit board; wherein
   at least part of the antenna is disposed on one side of a light emission surface of the display assembly; and
   the antenna comprises a radiator and a first feed structure connected to the radiator;
   wherein the feed circuit board is disposed on one side of the display assembly facing away from the light emission surface; and
   the feed circuit board comprises a power division network and a second feed structure connected to the power division network; and
   wherein the first feed structure at least partially overlaps the second feed structure along a thickness direction of the display assembly.

2. The display device according to claim 1, wherein the display device further comprises an adhesive layer, the adhesive layer is disposed between the feed circuit board and the display assembly, and the adhesive layer is in contact with the feed circuit board and the display assembly and the adhesive layer is connected to the feed circuit board and the display assembly.

3. The display device according to claim 2, wherein a hardness of the adhesive layer is greater than or equal to a hardness of an optically clear adhesive, and the adhesive layer comprises an inorganic layer.

4. The display device according to claim 2, wherein a support structure is disposed in the adhesive layer, and density of the support structure is greater than density of the adhesive layer;
   wherein the support structure is a spherical structure.

5. The display device according to claim 1, wherein the display assembly comprises a display region and a non-display region disposed around the display region; and
   wherein an overlapping region of the first feed structure and the second feed structure is located in the non-display region.

6. The display device according to claim 5, wherein
   the non-display region comprises a step wiring region, and the step wiring region is disposed on one side of the display region; and
   the overlapping region of the first feed structure and the second feed structure is disposed outside the step wiring region.

7. The display device according to claim 6, wherein the overlapping region of the first feed structure and the second feed structure is disposed on one side of the display region facing away from the step wiring region.

8. The display device according to claim 5, wherein
   the non-display region comprises a step wiring region, and the step wiring region is disposed on one side of the display region;
   the step wiring region is provided with a plurality of signal transmission lines; and
   the overlapping region of the first feed structure and the second feed structure is located in the step wiring region, and gaps exist between overlapping regions of first feed structures and second feed structures and the plurality of signal transmission lines.

9. The display device according to claim 8, wherein
   the plurality of signal transmission lines comprise a plurality of first signal lines and a plurality of second signal lines;
   the plurality of first signal lines are arranged along a first direction and extend along a second direction;
   the plurality of second signal lines are arranged along the first direction and extend along the second direction, and the plurality of second signal lines are disposed on at least one side of the plurality of first signal lines along the first direction; and
   along the first direction, the overlapping regions of the first feed structures and the second feed structures are located between the plurality of first signal lines and the plurality of second signal lines, or the overlapping regions of the first feed structures and the second feed structures are located on one side of the plurality of second signal lines facing away from the plurality of first signal lines.

10. The display device according to claim 1, wherein the display assembly comprises a display region and a non-display region around the display region; and
    the antenna comprises a radiator, and at least part of the radiator is located in the display region.

11. The display device according to claim 10, wherein the radiator located in the display region is made of a transparent conductive material.

12. The display device according to claim 10, wherein the radiator located in the display region is a mesh structure.

13. The display device according to claim 1, wherein the display device further comprises a protection structure, and the protection structure is disposed on one side of the antenna facing away from the display assembly;
    wherein the protection structure is in contact with and connected to the antenna, and the protection structure is a rigid protection structure.

14. The display device according to claim 13, wherein the antenna is in contact with and connected to the display assembly.

15. The display device according to claim 13, wherein
    the display device further comprises a transparent support film;
    the transparent support film is disposed on one side of the antenna facing the protection structure, or the transparent support film is disposed on one side of the antenna facing away from the protection structure; and
    the antenna is in contact with and connected to the transparent support film.

16. The display device according to claim 15, wherein
    the display assembly is a flexible display assembly, and the flexible display assembly comprises a non-bending region and a bending region; and
    at least part of the antenna and at least part of the transparent support film are disposed in the bending region.

17. The display device according to claim 16, wherein an overlapping region of the first feed structure and the second feed structure is located in the non-bending region.

18. The display device according to claim 15, wherein the display assembly is a rigid display assembly, and at least part of the antenna and at least part of the transparent support film are bent toward one side of the display assembly facing away from the light emission surface.

19. The display device according to claim 18, wherein
    the first feed structure is disposed on the side of the display assembly facing away from the light emission surface;

the display device further comprises an adhesive layer; and wherein the adhesive layer is disposed on one side of the transparent support film facing away from the antenna, and the adhesive layer is in contact with the feed circuit board and the transparent support film and the adhesive layer is connected to the feed circuit board and the transparent support film.

20. The display device according to claim 1, wherein the display device further comprises one side bezel, and the antenna comprises a radiator; and wherein at least part of the radiator is bent, and the side bezel is made of an insulation material.

21. The display device according to claim 1, wherein the display device further comprises a touch function layer, and the touch function layer is disposed on the side of the light emission surface of the display assembly; and at least part of the antenna is disposed on one side of the touch function layer facing away from the display assembly, and the antenna at least partially overlaps the touch function layer along the thickness direction of the display assembly.

22. The display device according to claim 1, wherein the display device further comprises a touch function layer, the touch function layer is located in the display assembly, and the antenna at least partially overlaps the touch function layer along the thickness direction of the display assembly.

23. The display device according to claim 1, wherein the feed circuit board comprises a support substrate and a grounding metal layer;

the power division network and the second feed structure are disposed on a same side of the support substrate, and the grounding metal layer is disposed on one side of the support substrate facing away from the power division network; and the grounding metal layer covers the power division network along a thickness direction of the support substrate.

24. The display device according to claim 23, wherein the display device further comprises a high frequency signal generator; and the power division network comprises a high frequency signal lead-in terminal, and the high frequency signal lead-in terminal is electrically connected to the high frequency signal generator.

25. The display device according to claim 1, wherein the feed circuit board comprises a first transparent region, and the first transparent region is provided with a first alignment mark;

the display assembly is provided with a second alignment mark; and along the thickness direction of the display assembly, the second alignment mark overlaps the first transparent region, and the second alignment mark is disposed corresponding to the first alignment mark, wherein the second alignment mark is disposed on the side of the display assembly facing away from the light emission surface, and/or the display assembly comprises a second transparent region, and the second alignment mark is located in the second transparent region.

26. The display device according to claim 25, wherein the display assembly is provided with a third alignment mark, and the third alignment mark is configured to calibrate a setting position of the antenna, wherein the third alignment mark is disposed on the side of the light emission surface of the display assembly, and/or the third alignment mark is located in the second transparent region.

27. The display device according to claim 26, wherein the second alignment mark and the third alignment mark are located in the second transparent region, and the second alignment mark and the third alignment mark are a same alignment mark.

28. The display device according to claim 25, wherein the power division network and the second feed structure are arranged along a third direction; and first alignment marks are located on two sides of second feed structures along a fourth direction, wherein the third direction intersects the fourth direction.

* * * * *